US010071903B2

(12) United States Patent
Liu et al.

(10) Patent No.: US 10,071,903 B2
(45) Date of Patent: Sep. 11, 2018

(54) LOW STIFFNESS FLEXURE

(71) Applicant: MEMS DRIVE, INC., Arcadia, CA (US)

(72) Inventors: Xiaolei Liu, South Pasadena, CA (US); Roman Gutierrez, Arcadia, CA (US); Guiqin Wang, Arcadia, CA (US); Benson Mai, Alhambra, CA (US); Matthew Ng, Rosemead, CA (US)

(73) Assignee: MEMS Drive, Inc., Arcadia, CA (US)

( * ) Notice: Subject to any disclaimer, the term of this patent is extended or adjusted under 35 U.S.C. 154(b) by 521 days.

(21) Appl. No.: 14/677,730

(22) Filed: Apr. 2, 2015

(65) Prior Publication Data
US 2015/0321900 A1 Nov. 12, 2015

Related U.S. Application Data

(60) Provisional application No. 61/989,457, filed on May 6, 2014.

(51) Int. Cl.
*B81B 3/00* (2006.01)
(52) U.S. Cl.
CPC ............ *B81B 3/0051* (2013.01); *B81B 3/007* (2013.01); *B81B 2203/0163* (2013.01); *Y10T 74/20* (2015.01)
(58) Field of Classification Search
CPC ................. B81B 3/0051; B81B 3/007; B81B 2203/0163
See application file for complete search history.

(56) References Cited

U.S. PATENT DOCUMENTS 4,706,374 A * 11/1987 Murakami ............. F16C 11/12
257/418
4,740,057 A * 4/1988 Dezso .................... G02B 7/026
267/160

(Continued)

FOREIGN PATENT DOCUMENTS

CN 1333178 A 10/2002
CN 101316789 A 12/2008

(Continued)

OTHER PUBLICATIONS

Notice of Allowance issued in counterpart U.S. Appl. No. 15/447,940 dated May 19, 2017.

(Continued)

*Primary Examiner* — David M Fenstermacher
(74) *Attorney, Agent, or Firm* — Brian J. Colandreo; Michael T. Abramson; Holland & Knight LLP

(57) ABSTRACT

A flexure includes a support first end connected to a first frame; a support second end connected to a second frame; and a buckled section connecting the first support end to the second support end. The length of the flexure is substantially greater than its width, and the width of the flexure is substantially greater than its thickness. During operation, the flexure is maintained in a buckled state where the flexure's stiffness is significantly less than in the unbuckled state. In one implementation, a stage includes a flexure array joining a first frame and a second frame, where: the first frame and the second frame are substantially on a plane; the flexure array is substantially on the plane prior to buckling by the flexures of the flexure array; and the flexure array is bent substantially out of the plane after buckling by the flexures.

20 Claims, 21 Drawing Sheets

(56) References Cited

U.S. PATENT DOCUMENTS

| | | | |
|---|---|---|---|
| 5,310,157 A | 5/1994 | Platus | |
| 5,475,318 A | 12/1995 | Marcus et al. | |
| 5,536,988 A | 7/1996 | Zhang | |
| 5,794,909 A | 8/1998 | Platus et al. | |
| 5,862,003 A | 1/1999 | Saif et al. | |
| 6,091,050 A * | 7/2000 | Carr | H05B 1/0216 219/201 |
| 6,275,325 B1 | 8/2001 | Sinclair | |
| 6,679,055 B1 * | 1/2004 | Ellis | B81B 3/0035 310/306 |
| 6,791,615 B1 | 9/2004 | Shiomi et al. | |
| 6,798,315 B2 * | 9/2004 | Schaefer | B81B 3/0021 200/244 |
| 7,106,370 B2 | 9/2006 | Shiomi et al. | |
| 7,489,340 B2 | 2/2009 | Koo et al. | |
| 7,667,757 B2 | 2/2010 | Ikeda | |
| 7,768,677 B2 | 8/2010 | Kawai | |
| 7,779,707 B2 * | 8/2010 | Shih | A61B 5/0053 73/862.639 |
| 7,876,362 B2 | 1/2011 | Krymski | |
| 7,889,260 B2 | 2/2011 | Hagiwara | |
| 7,923,894 B2 | 4/2011 | Obi et al. | |
| 8,138,564 B2 | 3/2012 | Kosaka et al. | |
| 8,148,874 B2 * | 4/2012 | Xie | B81B 3/0035 310/307 |
| 8,175,408 B2 | 5/2012 | Hagiwara | |
| 8,711,495 B2 | 4/2014 | Topliss | |
| 8,836,096 B2 | 9/2014 | Kosaka et al. | |
| 8,855,476 B2 | 10/2014 | Liu et al. | |
| 8,970,781 B2 | 3/2015 | Ryou | |
| 9,621,775 B2 * | 4/2017 | Ng | H04N 5/2254 |
| 9,733,027 B2 * | 8/2017 | Platus | F28F 9/26 |
| 9,791,014 B1 * | 10/2017 | McKnight | F16F 7/00 |
| 2002/0071046 A1 | 6/2002 | Harada | |
| 2005/0161751 A1 | 7/2005 | Geisberger et al. | |
| 2006/0092514 A1 | 5/2006 | Koo et al. | |
| 2006/0110108 A1 | 5/2006 | Hsieh et al. | |
| 2007/0002159 A1 | 1/2007 | Olsen et al. | |
| 2007/0076109 A1 | 4/2007 | Krymski | |
| 2007/0091415 A1 | 4/2007 | Tsuboi et al. | |
| 2007/0206238 A1 | 9/2007 | Kawai | |
| 2008/0017942 A1 | 1/2008 | Kosaka et al. | |
| 2010/0097507 A1 | 4/2010 | Krymski | |
| 2011/0141342 A1 | 6/2011 | Ming et al. | |
| 2012/0081598 A1 | 4/2012 | Calvet et al. | |
| 2012/0119614 A1 | 4/2012 | Gutierrez | |
| 2012/0146171 A1 | 6/2012 | Kosaka et al. | |
| 2012/0242363 A1 | 9/2012 | Breinlinger et al. | |
| 2013/0057757 A1 | 3/2013 | Ryou | |
| 2013/0076919 A1 | 3/2013 | Gutierrez et al. | |
| 2013/0077945 A1 | 3/2013 | Liu et al. | |
| 2014/0048240 A1 | 2/2014 | Platus | |
| 2015/0085363 A1 | 3/2015 | Liu et al. | |

FOREIGN PATENT DOCUMENTS

| | | |
|---|---|---|
| JP | 2006153804 A | 6/2006 |
| JP | 2006256438 A | 10/2008 |
| JP | 4801673 A | 2/2011 |
| JP | 2012123364 A | 6/2012 |
| JP | 2014510283 A | 4/2014 |
| KR | 1020060034201 A | 4/2006 |
| WO | 1991002921 A1 | 3/1991 |
| WO | 2013115059 A1 | 8/2013 |

OTHER PUBLICATIONS

Horsley, D. et al., Microfabricated Electrostatic Actuators for Hard Disk Drives, IEEE/ASME 1-22 Transactions on Mechatronics, Sep. 1998, pp. 1-9, vol. 3, No. 3.

Patent Cooperation Treaty, International Search Report for PCT/US2015/024161, dated Jul. 2, 2015, pp. 1-2.

Office Action dated Oct. 3, 2017 in counterpart Japanese Patent Application No. 2017-511146.

Supplementary European Search Report dated Dec. 15, 2017 in counterpart Application Serial No. EP15789553.

Preliminary Rejection issued in counterpart Korean Patent Application Serial No. 10-2016-7031551 dated Jan. 29, 2018.

Notification of the First Office Action and Search Report issued in counterpart Chinese Application No. 2015800226621 dated Dec. 19, 2017.

Non-Final Office Action issued in counterpart U.S. Appl. No. 15/686,710 dated May 22, 2018.

Office Action dated Jun. 5, 2018 in counterpart Japanese Patent Application No. 2017-511146.

* cited by examiner

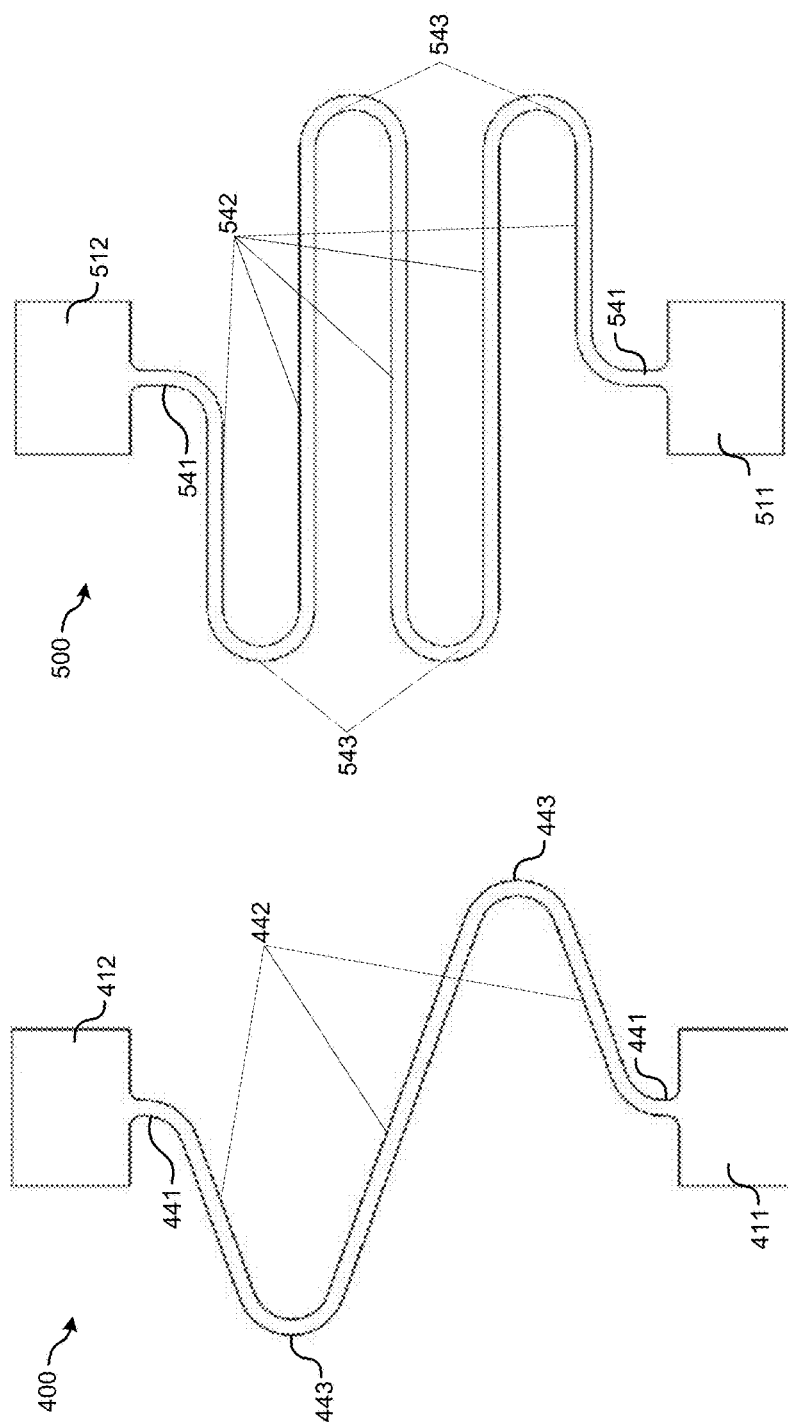

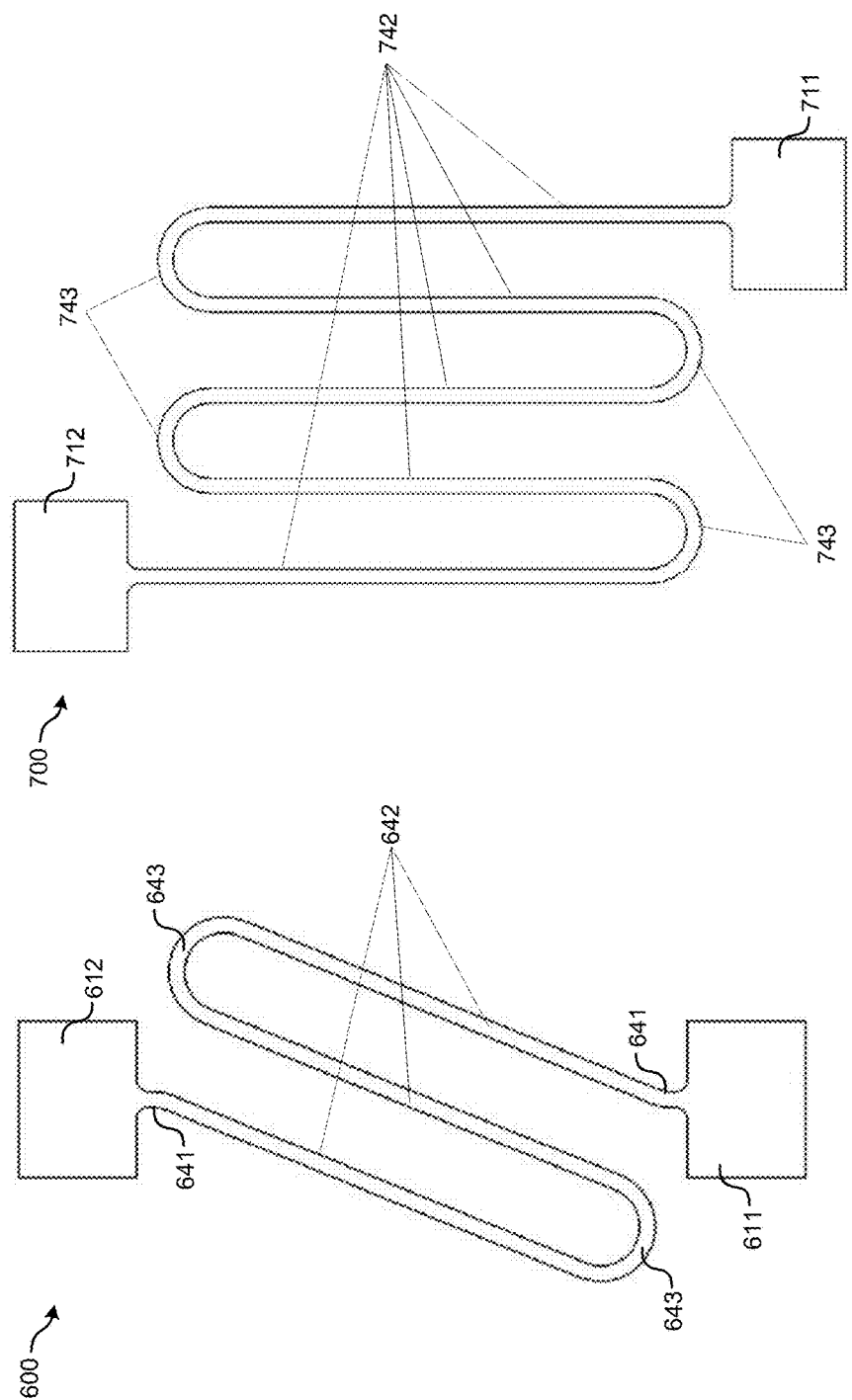

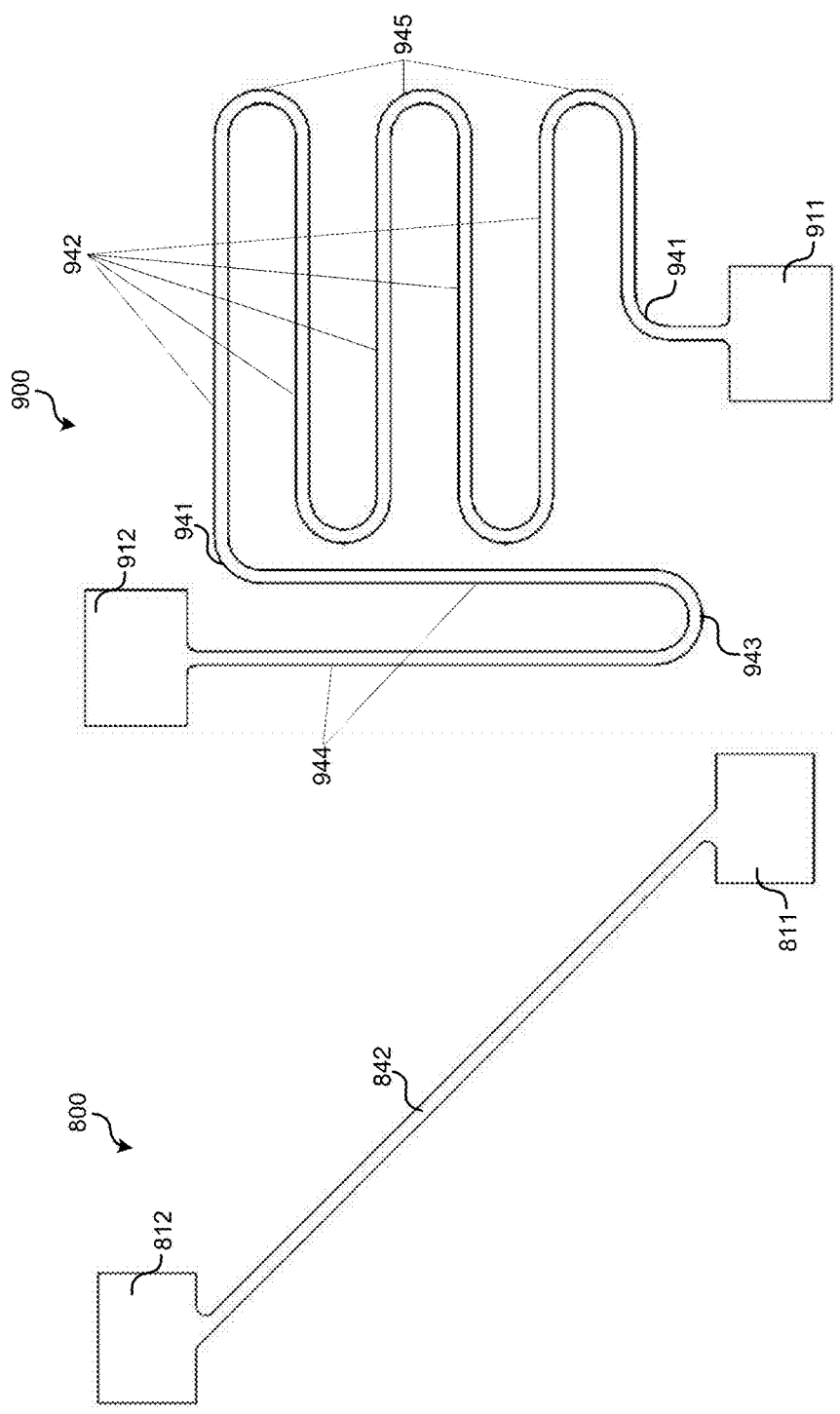

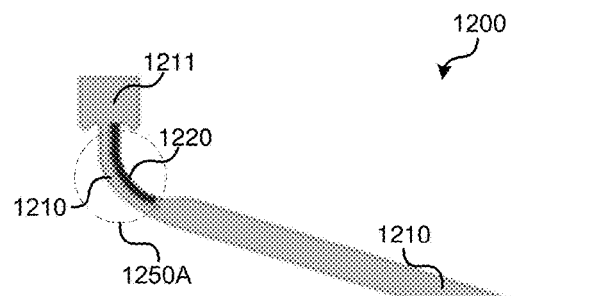
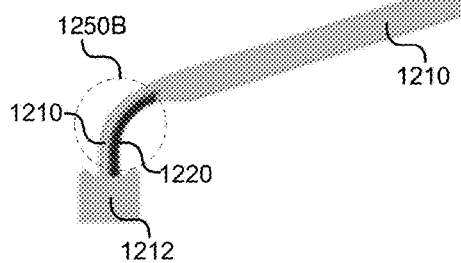
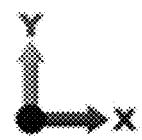
Fig. 18A
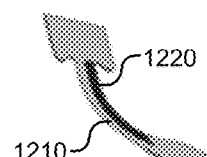
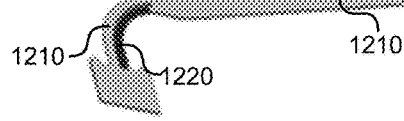
Fig. 18B

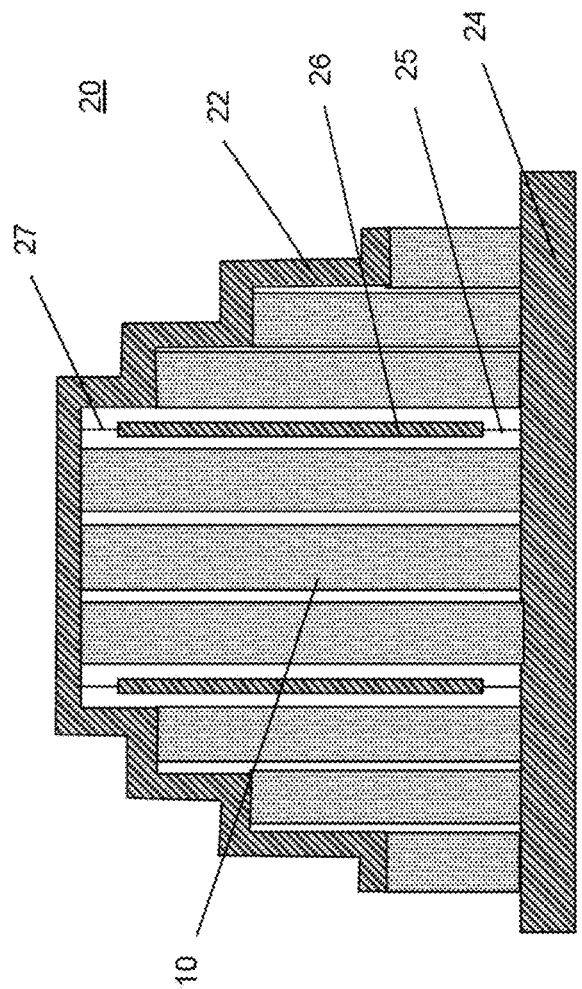
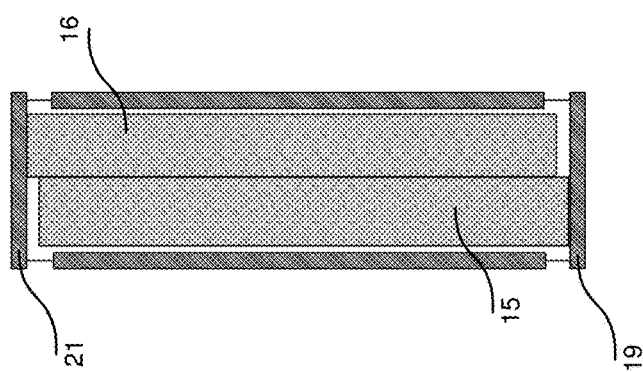
Fig. 21B
Fig. 21A

LOW STIFFNESS FLEXURE

CROSS-REFERENCE TO RELATED APPLICATIONS

This application claims the benefit of U.S. Provisional Patent Application No. 61/989,457 filed May 6, 2014, which is incorporated herein by reference in its entirety.

TECHNICAL FIELD

The present disclosure relates generally to flexures, and more particularly, to low stiffness flexures that may be used in actuators and motion stages such as, for example, motion stages for microelectromechanical systems (MEMS).

BACKGROUND

Flexures are used in systems where there is motion between one portion of the system and another. In order to create the motion, there must be a force. In some cases, this force comes from an actuator or motor that provides a controlled force that creates movement. In such systems, flexures are usually used to connect the moving portion of the system to the stationary portion of the system. The flexure must be designed so that its stiffness is low enough so as to not impede motion in the desired direction. In particular, to reduce the force requirements on the actuator or motor, the stiffness of the flexure must be as low as possible in the movement direction.

During design of a low stiffness flexure, the cross section of the flexure is usually designed to be as small as possible along the direction of bending, and the length is made as long as possible. However, there are limits on the design of the dimensions of conventional flexures. In some systems, these dimensions are limited by fabrication limits. For example, stamped metal flexures cannot be made too thin or too long without affecting handling and manufacturability. In other systems, the desire to make the cross section of the flexure as small as possible conflicts with other system requirements. For example, if the flexure is designed to carry electricity, making the flexure cross section very small increases the resistance, which wastes power and can lead to failure if enough current flows through the flexure.

BRIEF SUMMARY OF THE DISCLOSURE

In accordance with various embodiments, a new flexure is disclosed that includes a first support end connected to a first frame, a second support end connected to a second frame, and a buckled section connecting the first support end to the second support end. In the conventional design of flexures, buckling is avoided as it is associated with a sudden failure of a structural member when subjected to high compressive stress. This failure arises because buckling causes a dramatic reduction in stiffness. However, the flexure disclosed herein exploits this buckling effect by operating in the buckling state without failure, thereby allowing the stiffness of the flexure to be several orders of magnitude softer than when operated in a normal state.

In one embodiment of the disclosed technology, the flexure includes a first straight section, a second straight section and a buckled section joining the first and second straight sections. In one implementation of this embodiment, the flexure is composed of a polysilicon layer to provide optimum mechanical characteristics (e.g., improved flexibility) and a metal layer to provide optimum electrical characteristics (e.g., improved electrical conductivity). In further implementations of this embodiment, the stiffness of the flexure in the buckled state is at least one order of magnitude less than the stiffness of the flexure in the unbuckled state.

In another embodiment of the disclosed technology, a stage includes a flexure array comprising a plurality of flexures joining a first frame and a second frame, where the first frame and the second frame are substantially on a plane, the flexure array is substantially on the plane prior to buckling by the plurality of flexures, and the flexure array is bent substantially out of the plane after buckling by the plurality of flexures. In one embodiment, a motion limiter prevents the buckled plurality of flexures from failing by limiting motion of the flexure array.

In another embodiment of the disclosed technology, a method includes: providing a flexure with a length that is substantially greater than its width and thickness; displacing the flexure until it buckles; and maintaining the flexure in a buckled state during normal operation. In one embodiment, the method further includes limiting motion of the flexure using a motion limiter to prevent the flexure from failing in the buckled state.

Other features and aspects of the disclosure will become apparent from the following detailed description, taken in conjunction with the accompanying drawings, which illustrate, by way of example, the features in accordance with various embodiments. The summary is not intended to limit the scope of the invention, which is defined solely by the claims attached hereto.

BRIEF DESCRIPTION OF THE DRAWINGS

The disclosed technology, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 9 is a plan view of another example embodiment of a flexure in accordance with the disclosed technology.

FIG. 10 is a plan view of another example embodiment of a flexure in accordance with the disclosed technology.

FIG. 11 is a plan view of another example embodiment of a flexure in accordance with the disclosed technology.

FIG. 12 is a plan view of another example embodiment of a flexure in accordance with the disclosed technology.

FIG. 13 is a plan view of another example embodiment of a flexure in accordance with the disclosed technology.

FIG. 14 is a plan view of another example embodiment of a flexure in accordance with the disclosed technology.

FIG. 18A is a plan view of an example embodiment of a split root flexure as fabricated in accordance with the disclosed technology.

FIG. 18B is a plan view of the split root flexure of FIG. 18A as fabricated

FIG. 21A illustrates a plan view of a comb drive actuator that may use the disclosed flexures in accordance with embodiments of the disclosed technology.

FIG. 21B illustrates a plan view of a comb drive actuator that may use the disclosed flexures in accordance with embodiments of the disclosed technology.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION

In accordance with various embodiments of the disclosed technology, new flexures are disclosed that include a first end connected to a first frame, a second end connected to a second frame, and a buckled section connecting the first end to the second end. The disclosed flexures operate in the buckling state without failure, thereby allowing the stiffness of the flexure to be several orders of magnitude softer than when operated in a normal state. The flexures may be used in actuators and motion stages such as, for example, motion stages for microelectromechanical systems (MEMS). In one particular embodiment, the flexures may be implemented in a MEMS actuator that moves an image sensor of a camera package.

In various embodiments, illustrated below, the buckled section (i.e., flexible portion) of the flexures is designed to be flexible such that a cross section of the flexible portion along its direction of bending (i.e., thickness and width) is small, while its length is relatively long. For example, in embodiments the flexible section may be 10 to 30 micrometers wide, 1 to 3 micrometers thick, and 500 to 800 micrometers long. In one particular embodiment, the flexible section is 25 micrometers wide, 1.5 micrometers thick, and 600 micrometers long. Additionally, the flexures may be designed to fit geometric constraints and minimize stiffness and stress of the deformed flexure.

In embodiments, the flexures may be manufactured using MEMS technology by patterning their design using photolithography and etching a polysilicon layer deposited on a silicon wafer coated with oxide. In additional embodiments, the flexures may be fabricated using a variety of processes such as, for example, stamping, etching, laser cutting, machining, three dimensional printing, water jet cutting, etc. A variety of materials may be used to form the flexures, such as, for example, metal, plastic, and polysilicon. In implementations, the flexures may comprise one layer, two layers, or three layers of these materials. In one embodiment, a flexure is formed of layers of polysilicon and metal, whereby the polysilicon layer provides improved flexibility and reliability and the metal layer provides improved electrical conductivity. In further embodiments, further described below, the flexure may have a variable width, split layers, offset layers, or some combination thereof to achieve desired properties such as electrical conductivity and flexibility. As would be appreciated by one having skill in the art, other combinations of materials may be used to achieve the desired properties of the flexures.

Figure 1:
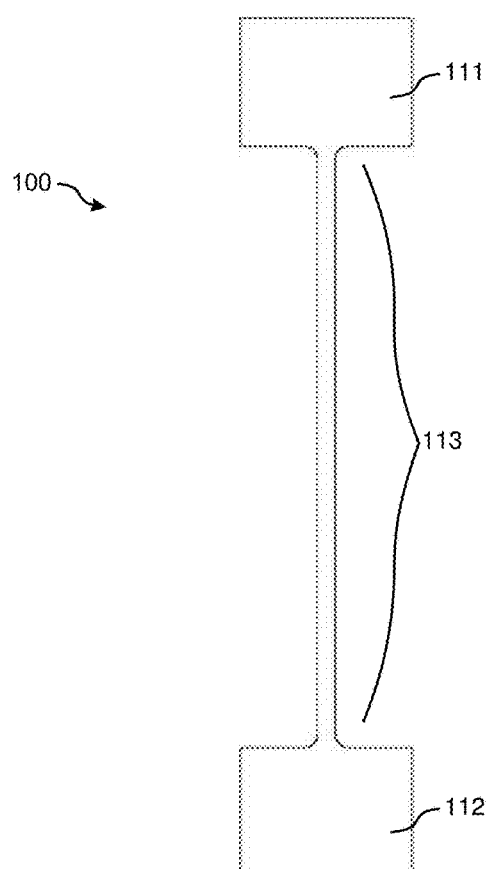
FIG. 1 is a plan view of an example embodiment of a flexure in accordance with the disclosed technology.
Figure 2A:
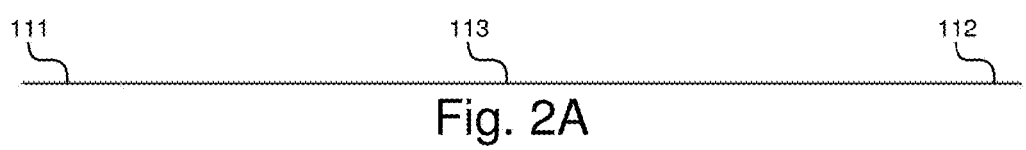
FIG. 2A is an edge view of the flexure of FIG. 1 as fabricated.
Figure 2B:
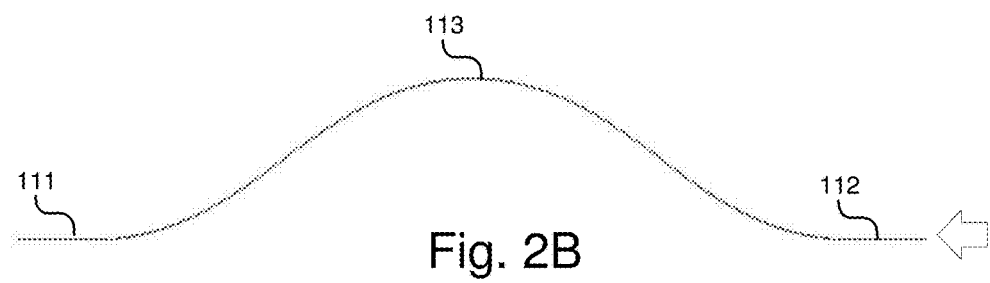
FIG. 2B is an edge view of the flexure of FIG. 1 in a buckled state.

FIG. 1 is a plan view of an exemplary flexure 100 in accordance with one embodiment. As illustrated, flexure 100 comprises a first support end 111, a second support end 112, and a flexible portion 113 connecting support end 111 to support end 112. As described above, in various embodiments flexible portion 113 is designed to be flexible such that a cross section of portion 113 along its direction of bending (i.e., thickness and width) is small, while its length is relatively long. FIGS. 2A-2B illustrate edge views of flexure 100. FIG. 2A illustrates flexure 100 in a pre-buckled state after fabrication. FIG. 2B illustrates flexure 100 in a buckled state. In one embodiment, illustrated by FIG. 2B, flexure 100 transitions to the buckled state after support end 112 is displaced toward support end 111, thereby causing flexible portion 113 to buckle up or down. Because the thickness of example flexure 100 is smaller than its width, flexure 100 buckles up or down as shown in FIG. 2B. In other embodiments where the thickness of the flexure is greater than its width, the flexible portion may buckle sideways.

Figure 3:
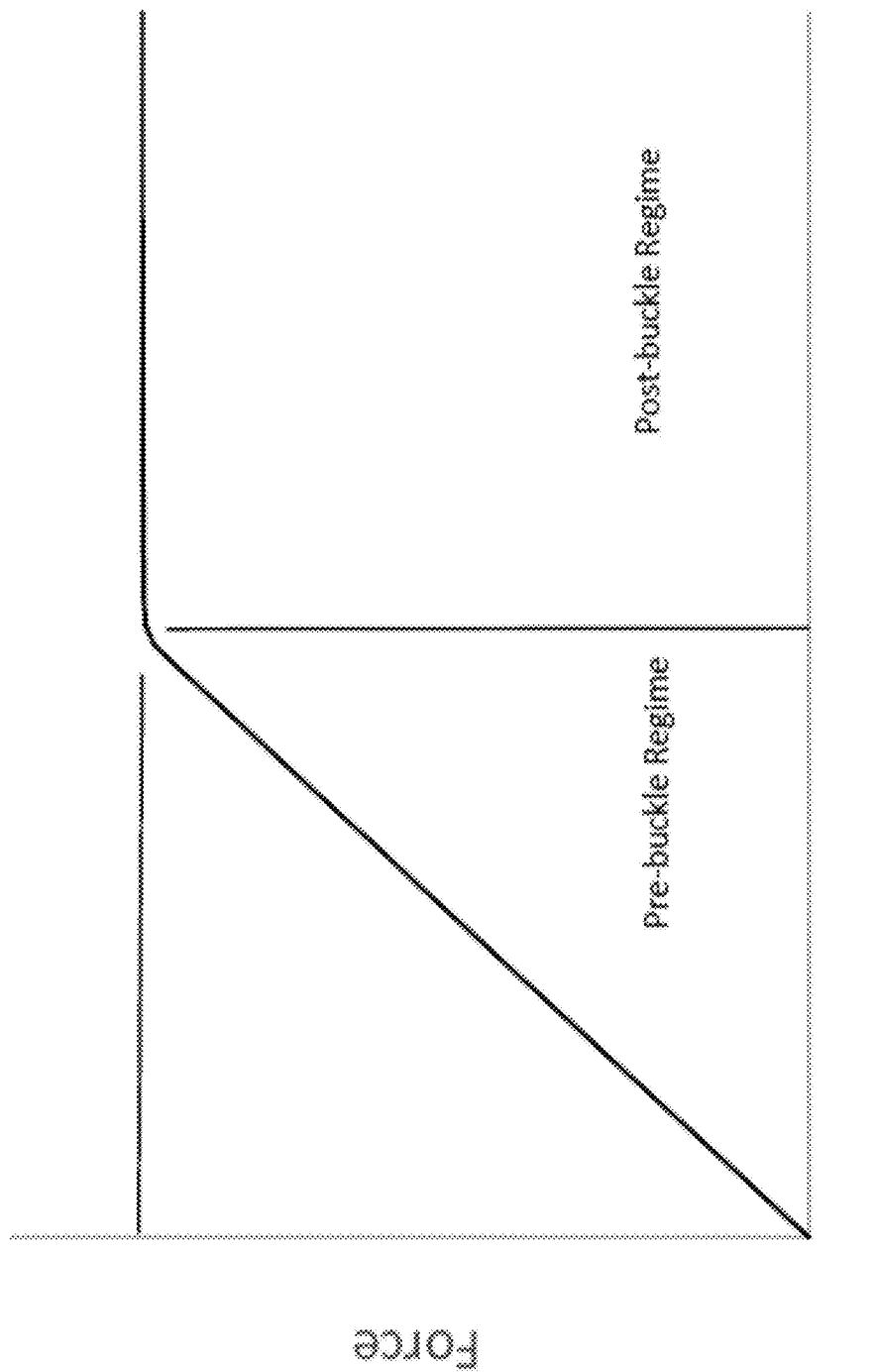
FIG. 3 is a Force versus Displacement plot of an example embodiment of a flexure in accordance with the disclosed technology.

FIG. 3 is a Force versus Displacement plot of an example embodiment of a flexure in accordance with the disclosed technology. As illustrated, there is a pre-buckle regime or state in which the stiffness of the flexure, calculated as the change in displacement divided by the change in force, is relatively high. Once the flexure buckles, the flexure enters a post-buckle regime in which the stiffness of the flexure is dramatically reduced. By operating in the post-buckle regime, the stiffness of the flexure is dramatically lowered. Accordingly, in various embodiments of the disclosed technology, the flexure operates in the post-buckle regime (e.g., as illustrated by FIG. 2B) as opposed to the pre-buckle or fabricated regime (e.g., as illustrated by FIG. 2A). To prevent failure of the flexure, in various embodiments a motion limiter that limits motion of the flexure may be included in a system (e.g., actuator) that includes the flexure.

Figure 4A:
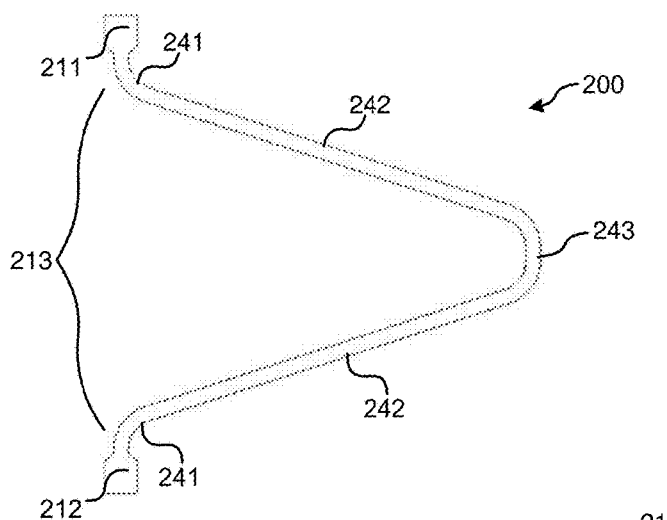
FIG. 4A is a plan view of another example embodiment of a flexure in accordance with the disclosed technology.

FIG. 4A is a plan view of another example flexure 200 in accordance with the disclosed technology. As illustrated, flexure 200 comprises a first support end 211, a second support end 212, and a flexible portion 213 connecting first support end 211 and second support end 212. Like flexure 100, flexure 200 buckles in radial directions between support ends 211 and 212 and has low stiffness in the post-buckle regime. Additionally, the design of flexure 200 provides low stiffness in a tangential direction to support ends 211 and 212. In particular, flexure 200 has a "V"-shaped design comprising two long and straight portions 242, curved portions 241 connecting straight portions 242 to support ends 211-212, and a curved portion 243 connecting straight portions 242 together.

In various embodiments, the curvatures of curved portions 241-242, the angle of the "V" and the length of straight portions 242 are designed to fit geometric constraints and minimize stiffness and stress of the deformed flexure. For example, in one particular embodiment the angle of the "V" shape can be 35 degrees, the radii of curvatures 241 and 243 can be 50 micrometers, the length of the straight portions 242 can be 650 micrometers, and the separation between the support ends 211 and 212 can be 700 micrometers.

Figure 4B:
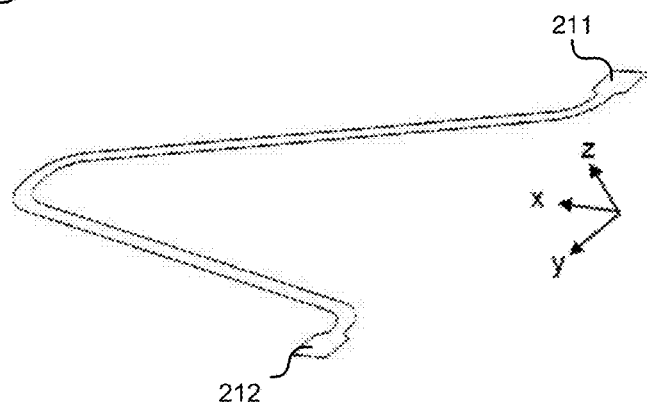
FIG. 4B is a three-dimensional perspective view of the flexure of FIG. 4A as fabricated.
Figure 4C:
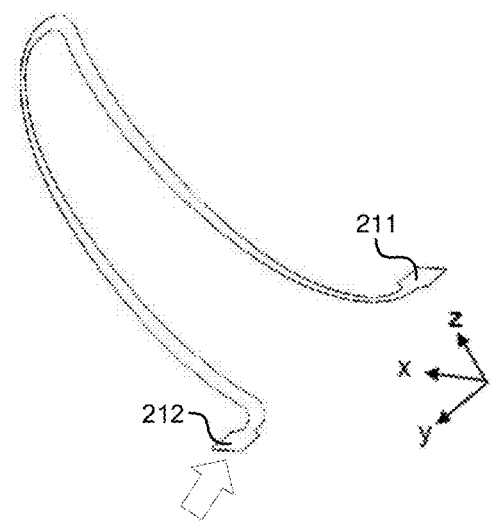
FIG. 4C is a three-dimensional perspective view of the flexure of FIG. 4A in a buckled state.

FIGS. 4B-4C illustrate three-dimensional perspective views of flexure 200. FIG. 4B illustrates flexure 200 as fabricated. FIG. 4C illustrates flexure 200 in a buckled state. In one embodiment, illustrated by FIG. 4C, flexure 200 transitions to the buckled state after support end 212 is deflected toward support end 211, thereby causing flexible portion 213 to buckle in three dimensions. Because the thickness of example flexure 200 is smaller than its width, and because of the "V"-shaped geometric design, flexure 200 buckles in three dimensions. This ensures that the buckled flexure has very low stiffness between support ends 211 and 212 in both radial and tangential directions (i.e., x and y directions shown in FIGS. 4B-4C).

Figure 5:
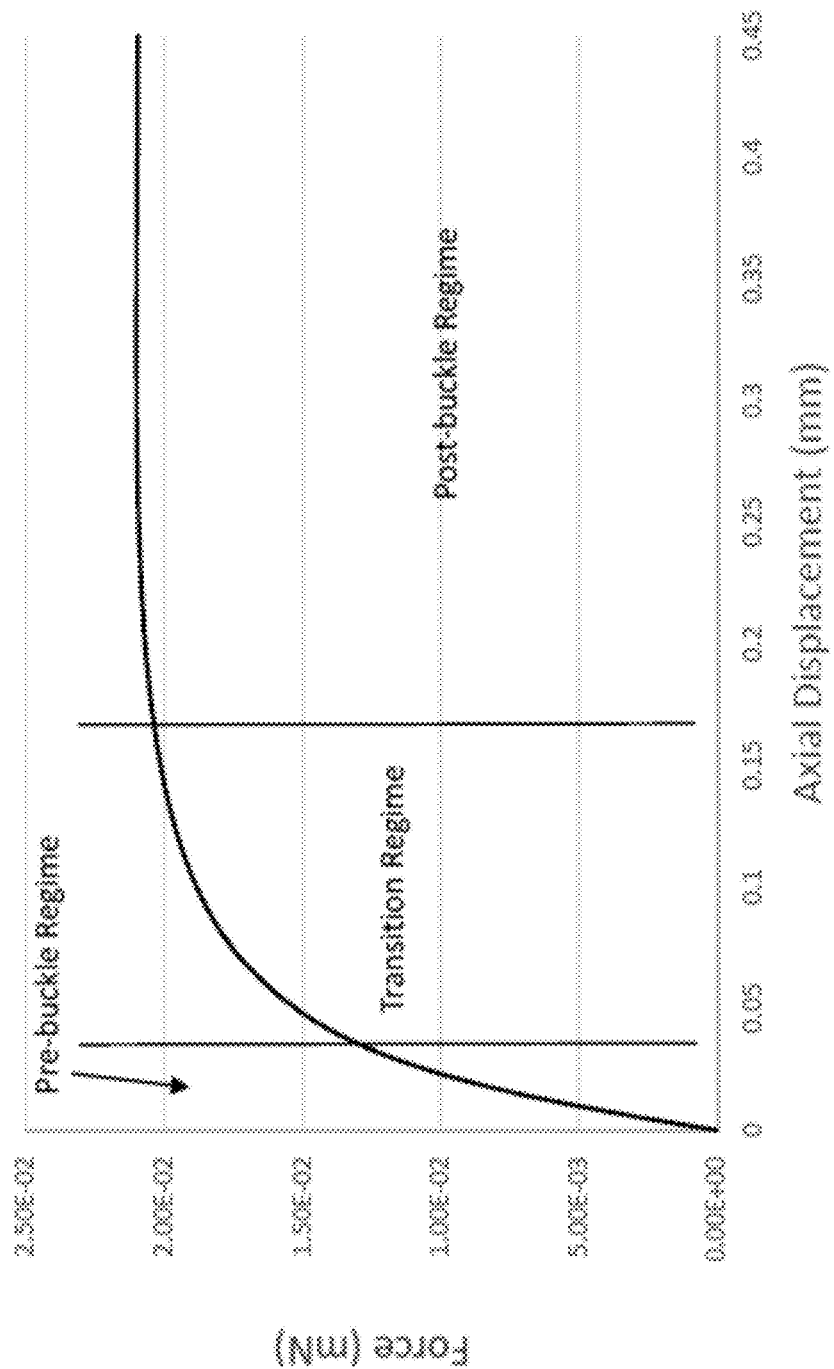
FIG. 5 is a Force versus Displacement plot of the flexure of FIG. 4A.

FIG. 5 is a biased Force versus biased Displacement plot of flexure 200 that was calculated using finite element analysis. As illustrated, there is a pre-buckle regime with low axial displacement of moving support end 212, in which the stiffness of flexure 200, calculated as the change in displacement divided by the change in force, is relatively high. This pre-buckle regime between zero axial displacement and approximately 0.05 mm axial displacement corresponds to the shape shown in FIG. 4B. After flexure 200 buckles, the stiffness of the flexure is dramatically reduced. This post-buckle regime beyond approximately 0.15 mm axial displacement corresponds to the shape shown in FIG. 4C. In this embodiment, there is a gradual transition regime between the pre-buckle and post-buckle regimes between approximately 0.05 mm and 0.15 mm axial displacement. By operating in the post-buckle regime, the stiffness of the flexure is dramatically lowered. As illustrated by FIG. 5, in the post-buckle regime the stiffness of the flexure may be several orders of magnitude less than in the pre-buckle regime. Accordingly, in various embodiments of the disclosed technology, the flexure operates in the post-buckle regime (e.g., as illustrated by FIG. 3C) as opposed to the pre-buckle or fabricated regime (e.g., as illustrated by FIG. 3B).

Figure 6:
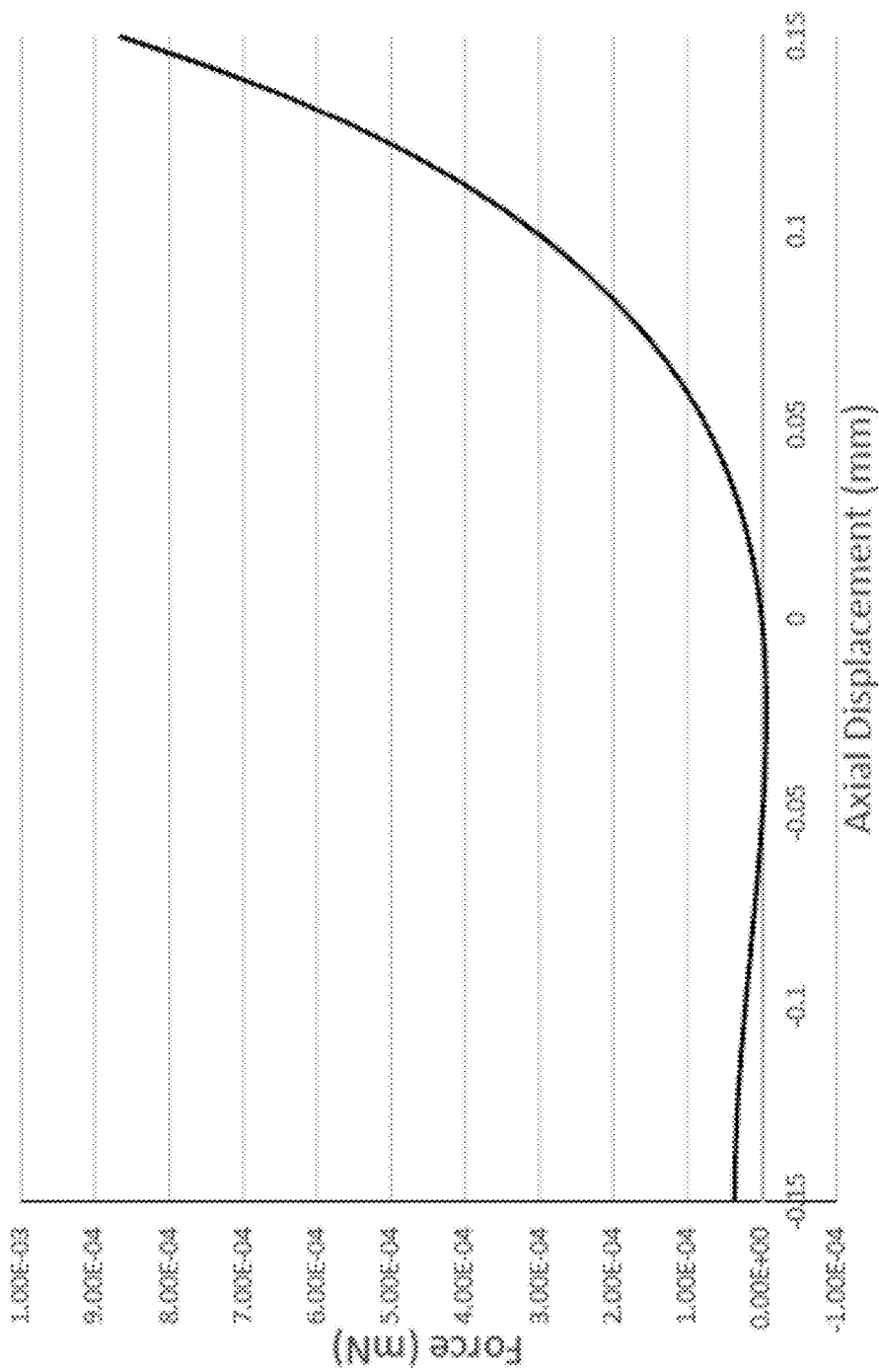
FIG. 6 is a Biased Force versus Biased Axial Displacement plot of the flexure of FIG. 4A in a buckled state.

FIG. 6 is a Biased Force versus Biased Displacement plot of flexure 200 in a buckled state. As illustrated, flexure 200 is pre-deformed axially by displacing the moving support end 212 toward the stationary support end 211 by 300 micrometers. The change in force corresponding to axial displacement toward the biased position is shown. The force required to generate a displacement of 150 micrometers to the biased position is less than 0.9 micro-Newtons. In embodiments, the biased force versus biased displacement may be nonlinear and asymmetric. However, since the flexure is softer than the system's stiffness in various embodiments, the nonlinearity that flexure 200 may introduce to the system is negligible.

Figure 7:
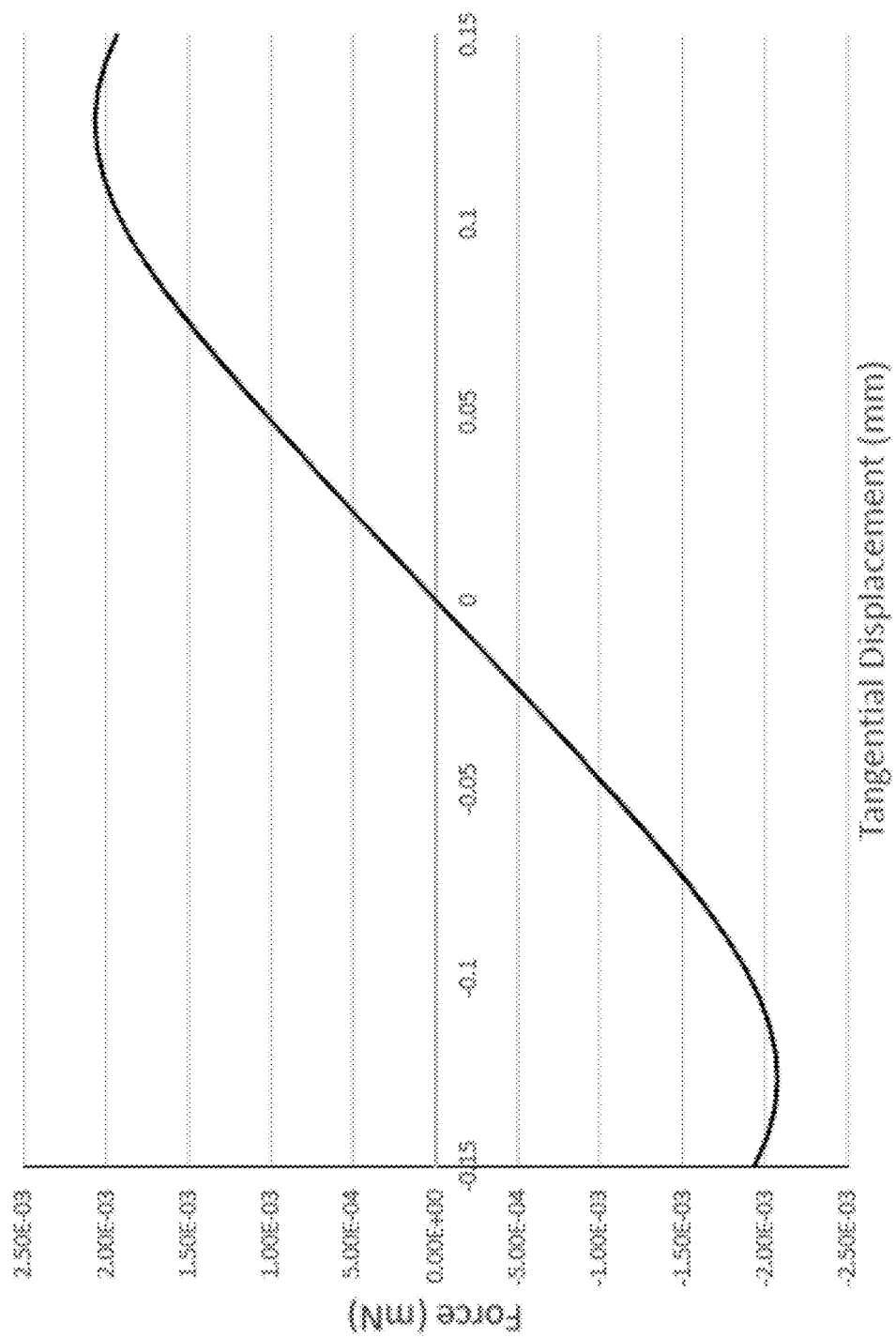
FIG. 7 is a Tangential Force versus Tangential Displacement plot of the flexure of FIG. 4A in a buckled state.

As described above, flexure 200 is pre-deformed axially to the biased position by displacing moving support end 213 toward stationary support end 212 (e.g., by 300 micrometers). Afterward, the tangential force corresponding to tangential displacement may be measured and plotted as shown in FIG. 7. As illustrated, the force required to generate a tangential displacement of 150 micrometers is less than 2.5 micro-Newtons. The force is linear within the range of ±0.12 micrometers, and starts to curve outside of this range. However, since the flexure is very soft in various embodiments, the nonlinearity that flexure 200 may introduce to the system is negligible. In various embodiments, the plots of FIGS. 6 and 7 may be used to design a full flexure system.

Figure 8:
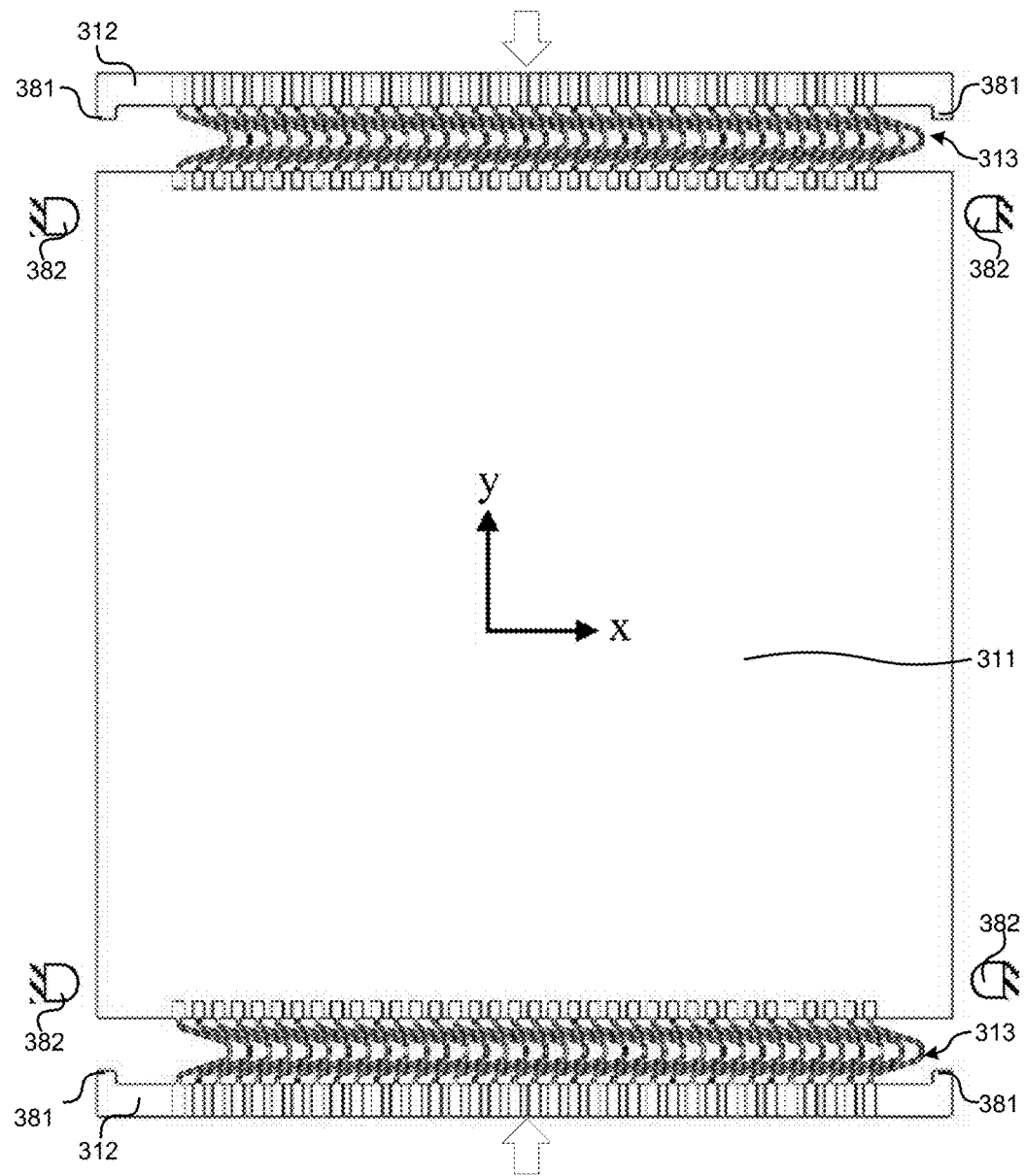
FIG. 8 is a plan view of an example embodiment of a stage using an array of flexures in accordance with the disclosed technology.

FIG. 8 is a plan view of an example embodiment of a stage using an array of flexures in accordance with the disclosed technology. As illustrated, the stage includes a movable platform 311 connected to rigid bars or support ends 312 by flexure arrays 313. In this embodiment, for each of the flexures of flexure arrays 313 the first support end is part of movable platform 311 of the stage, the second support end is directly connected to one of rigid bars 312, and a flexible portion connects the first support end (movable platform 311) to the second support end (rigid bars 312). In various embodiments, Illustrated by FIG. 8, low stiffness in two-dimensional motion may be achieved by pushing the rigid bars 312 toward each other (e.g., in the illustrated y direction) such that the flexures of flexure arrays 313 enter the post-buckle regime in their full motion range. In these embodiments, the forces exerted by the flexure arrays 313 may balance out on both sides such that there is no net force on platform 311.

In various embodiments, the stage and/or a system including the stage may include motion limiters that limit horizontal and vertical motion of movable platform 311, and correspondingly, the flexures. For example, in FIG. 8 the system includes motion limiters 381 that limit motion in the vertical y direction, as well as motion limiters 382, that limit motion in the horizontal x direction. As illustrated, motion limiters 381 are incorporated into rigid bars 312, thereby preventing excessive movement of the first support ends of flexures 313 with respect to the second support ends. Motion limiters 382 prevent horizontal over displacement of the movable platform 311 relative to rigid bars or support ends 312. Accordingly, motion limiters 381-382 may prevent failure of the buckled portion of flexures 313 due to excessive displacement in the x-y plane.

In additional embodiments, the flexures 313 may carry electrical current from the movable platform 311 to the rigid ends 312. In these embodiments, the flexures 313 may carry electrical current to an electrical component of the stage (e.g., an image sensor). For example, electrical pads may contact an electrical component of movable platform 311 and a circuit board of rigid ends 312. In this example, each of the flexure support ends may contact a respective electrical pad. In implementations of these embodiments, flexures 313 carry electrical current with low resistance and are designed to be as soft as possible to avoid additional force requirements on the motors (not shown) that move the stage.

FIG. 9 is a plan view of another example embodiment of a flexure 400 in accordance with the disclosed technology. As illustrated, flexure 400 comprises first support end 411, second support end 412, and a flexible portion connecting support end 411 and support end 412. Flexure 400 has an "S"-shaped design with the flexible portion comprising long and straight portions 442, curved portions 441 connecting straight portions 442 to support ends 411-412, and curved portions 443 connecting straight portions 442 with each other. In various embodiments, the curvatures of curved portions 441 and 443, the angles between straight portions 442, and the length of straight portions 442 are designed to fit geometric constraints and minimize stiffness and stress of the deformed flexure.

FIG. 10 is a plan view of another example embodiment of a flexure 500 in accordance with the disclosed technology. As illustrated, flexure 500 comprises first support end 511, second support end 512, and a flexible portion connecting support end 511 and support end 512. Flexure 500 has a serpentine-shaped design with the flexible portion comprising long and straight portions 542, curved portions 541 connecting straight portions 542 with support ends 511-512, and curved portion 543 connecting straight portions 542 with each other. In various embodiments, the curvatures of curved portions 541 and 543, the number of turns in the serpentine design, and the length of straight portions 542 are designed to fit geometric constraints and minimize stiffness and stress of the deformed flexure.

FIG. 11 is a plan view of another example embodiment of a flexure 600 in accordance with the disclosed technology. As illustrated, flexure 600 comprises first support end 611, second support end 612, and a flexible portion connecting support end 611 and support end 612. Flexure 600 has an "S"-shaped design with the flexible portion comprising long and straight portions 642 aligned in a radial direction, curved portions 641 connecting straight portion 642 and support ends 611-612, and curved portions 643 connecting the straight portions with each other.

FIG. 12 is a plan view of another example embodiment of a flexure 700 in accordance with the disclosed technology. As illustrated, flexure 700 comprises first support end 711, second support end 712, and a flexible portion connecting support end 711 and support end 712. In flexure 700, support ends 711 and 712 are not tangentially aligned. Flexure 700 has an serpentine-shaped design with the flexible portion comprising long and straight vertical portions 742, and curved portions 743 connecting portions 742 with each other and with support ends 711-712.

FIG. 13 is a plan view of another example embodiment of a flexure 800 in accordance with the disclosed technology. As illustrated, flexure 800 comprises first support end 811, second support end 812, and a long and straight flexible portion 842 connecting support end 811 and support end 812. In flexure 800, support ends 811 and 812 are not tangentially aligned.

FIG. 14 is a plan view of another example embodiment of a flexure 900 in accordance with the disclosed technology. As illustrated, flexure 900 comprises first support end 911, second support end 912, and a flexible portion connecting support end 911 and support end 912. In flexure 900, support ends 911 and 912 are not tangentially aligned. Flexure 900 has a serpentine-shaped design with the flexible portion comprising horizontal, long and straight portions 942, vertical, long and straight portions 944, curved portions 941 connecting vertical portions 944 with horizontal portions 942, curved portion 943 connecting the vertical portions 944 with each other, and curved portions 945 connecting the horizontal portions 942 with each other.

In various embodiments, the shape of the flexures may be generalized by counting the numbers of horizontal and vertical straight portions of the flexure. For example, assume (n, m) represents a design with n vertical or close to vertical straight stripes, and m horizontal or close to horizontal straight stripes. In such an implementation, flexure 400 may be named as (0, 3), flexure 500 as (0, 5), flexure 600 as (3, 0), flexure 700 as (5, 0), flexure 800 as (1, 1), and flexure 900 as (2, 6).

Figure 15:
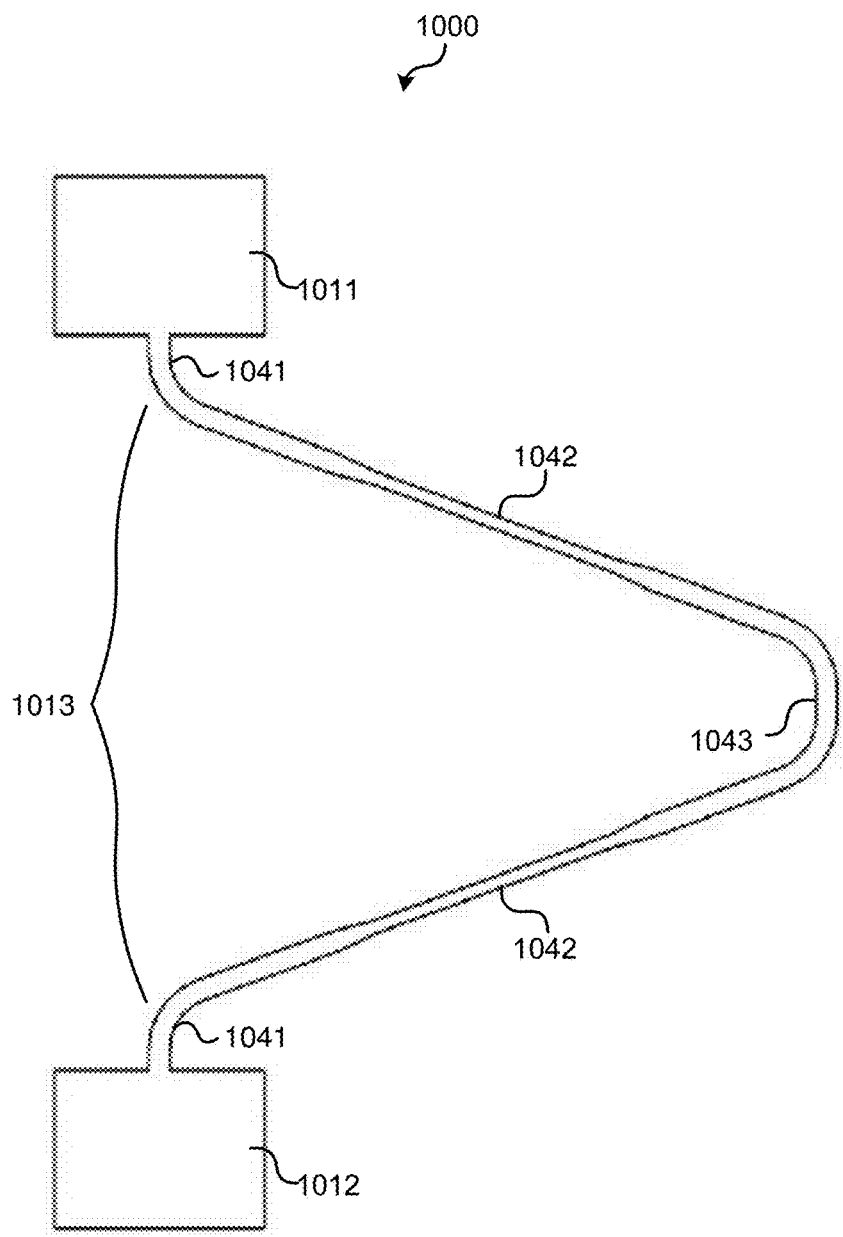
FIG. 15 is a plan view of an example embodiment of a variable width flexure in accordance with the disclosed technology.

FIG. 15 is a plan view of an example embodiment of a variable width flexure 1000 in accordance with the disclosed technology. As illustrated, flexure 1000 comprises first support end 1011, second support end 1012, and a flexible portion 1013 connecting support end 1011 and support end 1012. Flexure 1000 has a "V"-shaped design with the flexible portion 1013 comprising long and straight portions 1042 of variable width, curved portions 1041 connecting straight portions 1042 and support ends 1011-1012, and curved portion 1043 connecting straight portions 1042 with each other. In flexure 1000, the straight portions 1042 have a variable width, which in various embodiments may be adjusted to provide flexibility in the design of the flexure to tune the flexure's stiffness and other physical properties, such as, for example, the electrical resistance of the flexure. It should be noted that one having skill in the art would appreciate that a variable width could be implemented in the design of other flexures (e.g., those illustrated in FIGS. 5-14) to tune the aforementioned physical properties (e.g., electrical resistance and stiffness).

Figure 16:
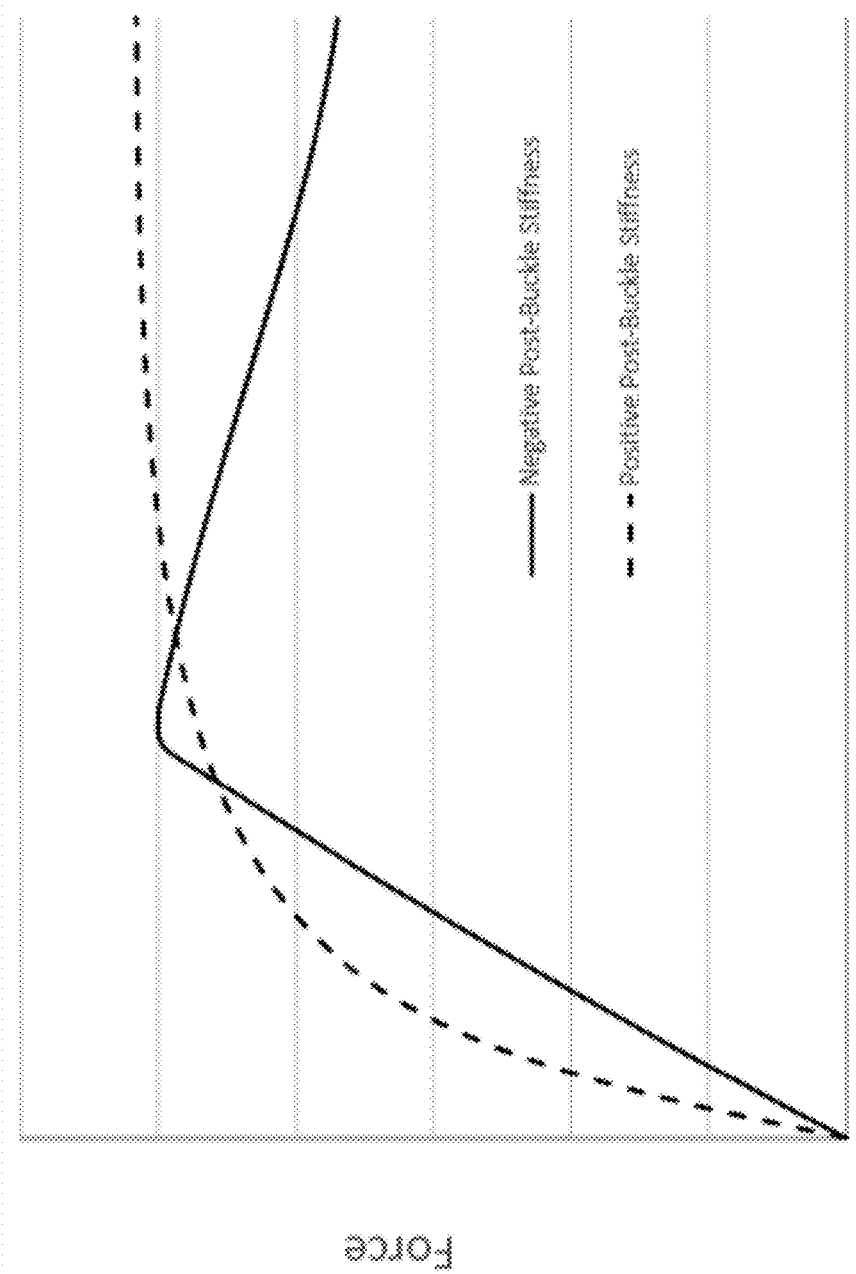
FIG. 16 is a Normalized Force versus Normalized Displacement plot showing the performance of different flexure designs in accordance with various embodiments of the disclosed technology.

FIG. 16 is a Normalized Force versus Normalized Displacement plot showing the performance of different flexure designs in accordance with various embodiments of the disclosed technology. As illustrated, the flexure may have a positive stiffness or negative stiffness in different post-buckle operation regimes.

Figure 17A:
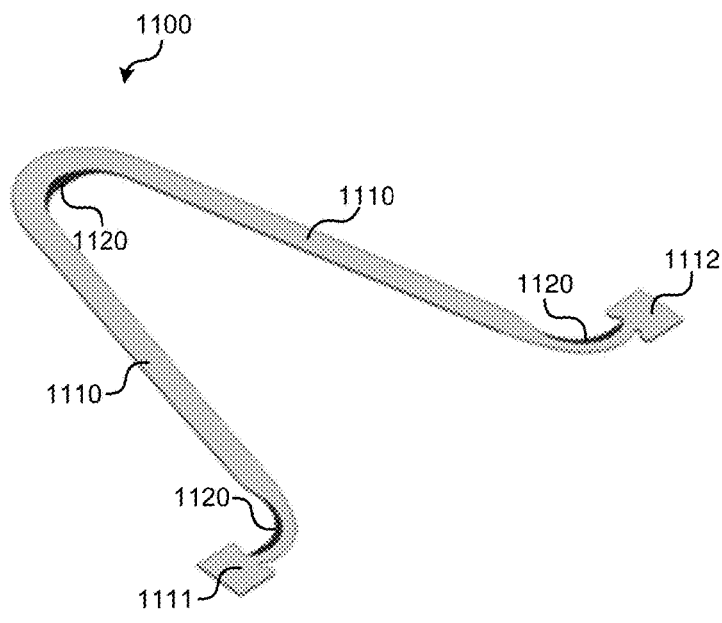
FIG. 17A is a top plan view of an example embodiment of an offset layer flexure as fabricated in accordance with the disclosed technology.
Figure 17B:
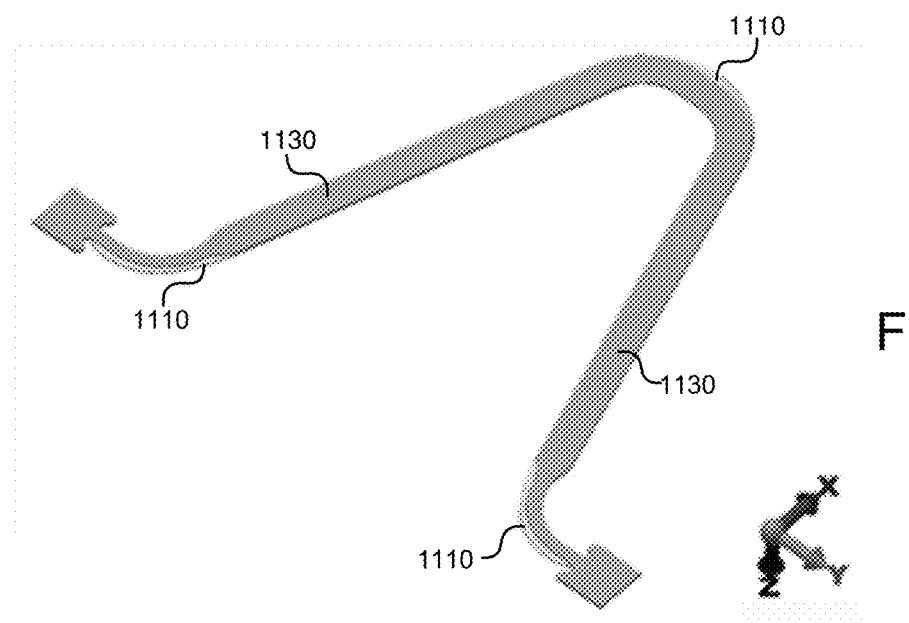
FIG. 17B is a bottom plan view of the offset layer flexure of FIG. 17A as fabricated.
Figure 17C:
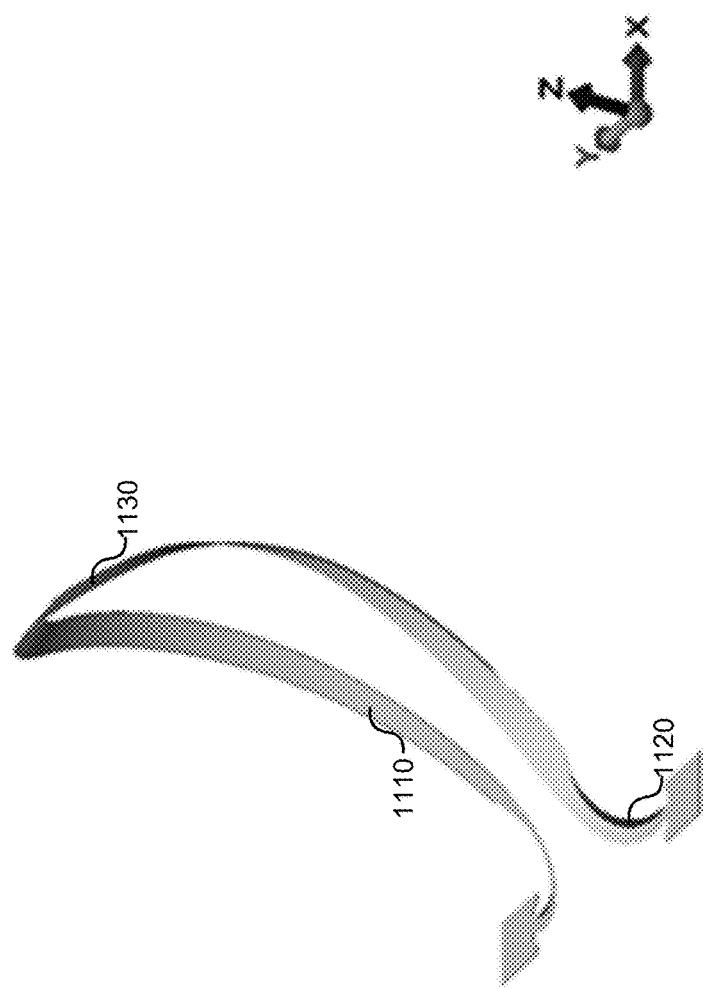
FIG. 17C is a three-dimensional perspective of the offset layer flexure of FIG. 17A in a buckled state.

FIGS. 17A-17C illustrate an example embodiment of a flexure 1100 comprising offset layers in accordance with the disclosed technology. FIGS. 17A and 17B are top and bottom plan views of flexure 1100 after fabrication. FIG. 17C is a three-dimensional perspective view of flexure 1100 in a buckled state. As illustrated, flexure 1100 includes a metal layer 1110, a third layer 1130, and a polysilicon layer 1120 between metal layer 1110 and third layer 1130. In embodiments, the third layer may comprise silicon oxide or a similar material. In flexure 1100, metal layer 1110 is offset from polysilicon layer 1120 and third layer 1130, thereby providing the benefit of reducing stress on flexure 1100 when it enters a buckled state shown in FIG. 17C.

Additionally, flexure 1100 comprises a variable width flexible portion that is narrower near the root ends of the flexure (i.e., the curved portions directly connected to support ends 1111 and 1112), and wider at the center of the flexible portion. In this embodiment, the narrower width near support ends 1111 and 1112 reduces the stiffness of flexure 1100 in a buckled state. The greater width at the center of the flexible portion improves the electrical resistance of flexure 1100.

Figure 18C:
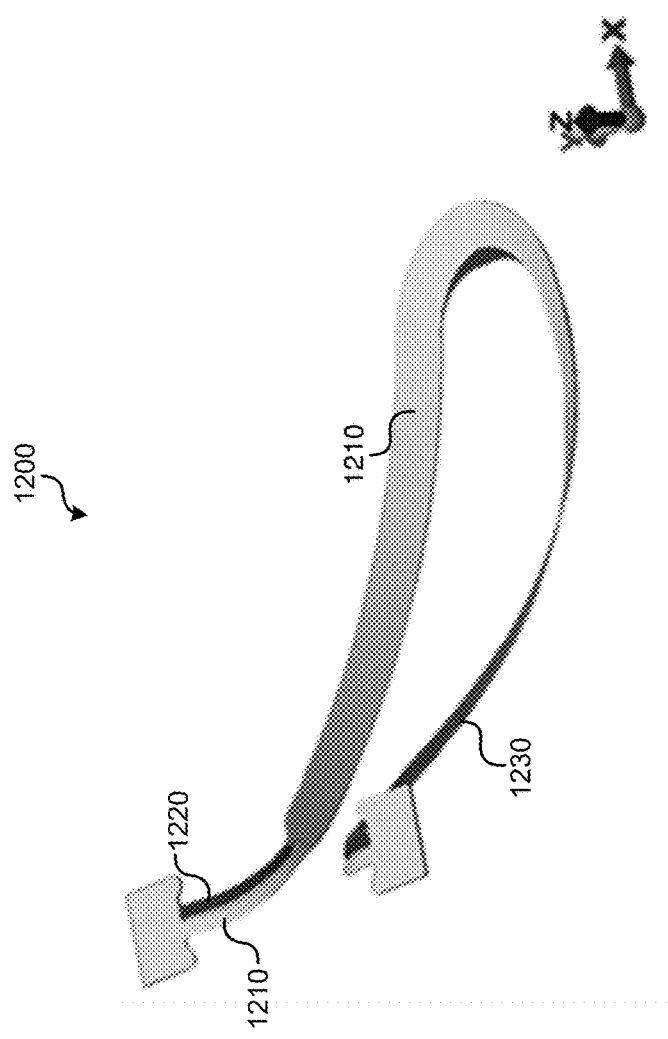
FIG. 18C is a three-dimensional perspective of the split root flexure of FIG. 18A in a buckled state.

FIGS. 18A-18C illustrate an example embodiment of a flexure 1200 comprising split roots in accordance with the disclosed technology. FIGS. 18A and 18B are top and bottom plan views of flexure 1200. FIG. 18C is a three-dimensional perspective view of flexure 1200 in a buckled state. As illustrated, flexure 1200 comprises split roots of metal 1210 and polysilicon 1220 at the curved portions 1250A-B directly connected to support ends 1211 and 1212 (i.e., near root ends of flexure). In embodiments, third layer 1230 and metal layer 1220 may also be split.

Figure 19A:
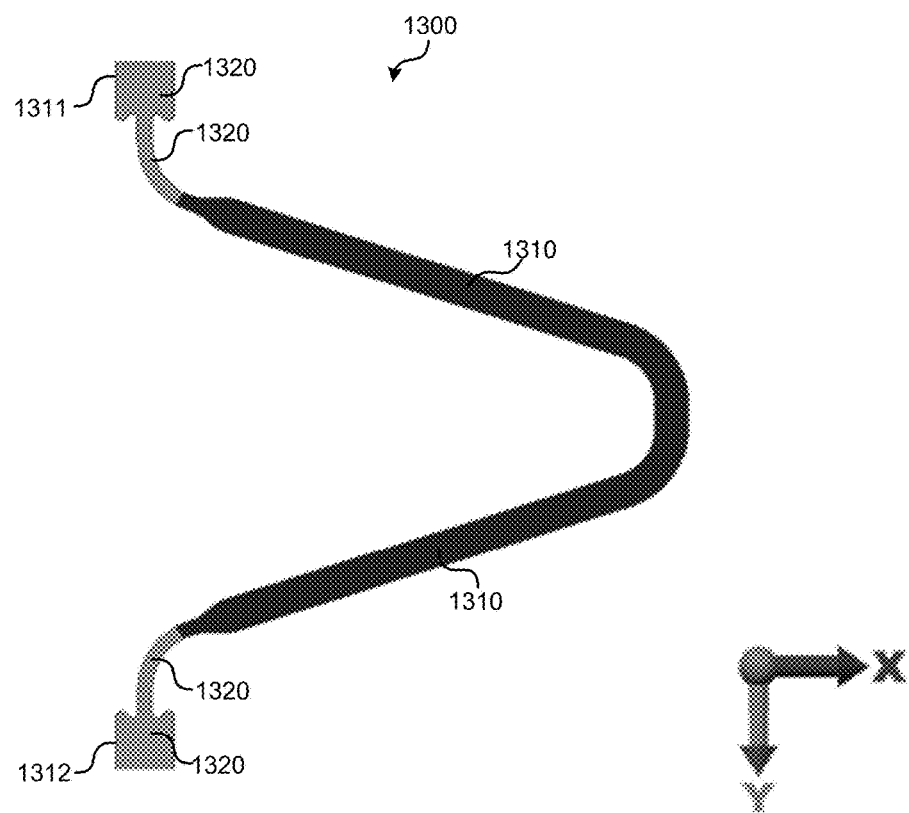
FIG. 19A is a plan view of an example embodiment of a flexure comprising different length layers in accordance with the disclosed technology.
Figure 19B:
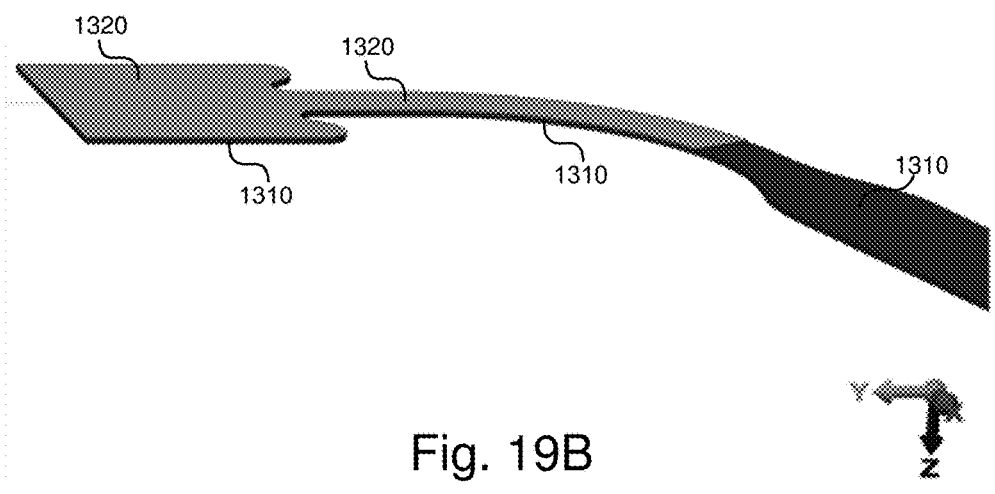
FIG. 19B is a three-dimensional perspective view of the flexure of FIG. 19A.

FIGS. 19A-19B illustrate an example embodiment of a flexure 1300 comprising different length layers in accordance with the disclosed technology. FIG. 19A is a plan view and FIG. 19B is a three-dimensional perspective view of flexure 1300. As illustrated, flexure 1300 includes a metal layer 1310 and a partial silicon oxide layer 1320 over metal layer 1310. In flexure 1300, only metal layer 1310 covers the entire length of the flexure, thereby ensuring lower stress and lower stiffness of flexure 1300. By contrast, silicon oxide layer 1320 only covers the ends of the flexure (support sections 1311-1312 and end of flexible section), thereby ensuring that the flexure buckles in the correct direction. In embodiments, layer 1320 can be silicon oxide or any other material that can provide a residual stress to curve the metal flexure 1300 up to the wanted direction. As would be appreciated by one having skill in the art, the lengths of the layers of the flexure may be varied to tune the physical properties of the flexure such as, for example, its stiffness and electrical resistance.

Figure 20:
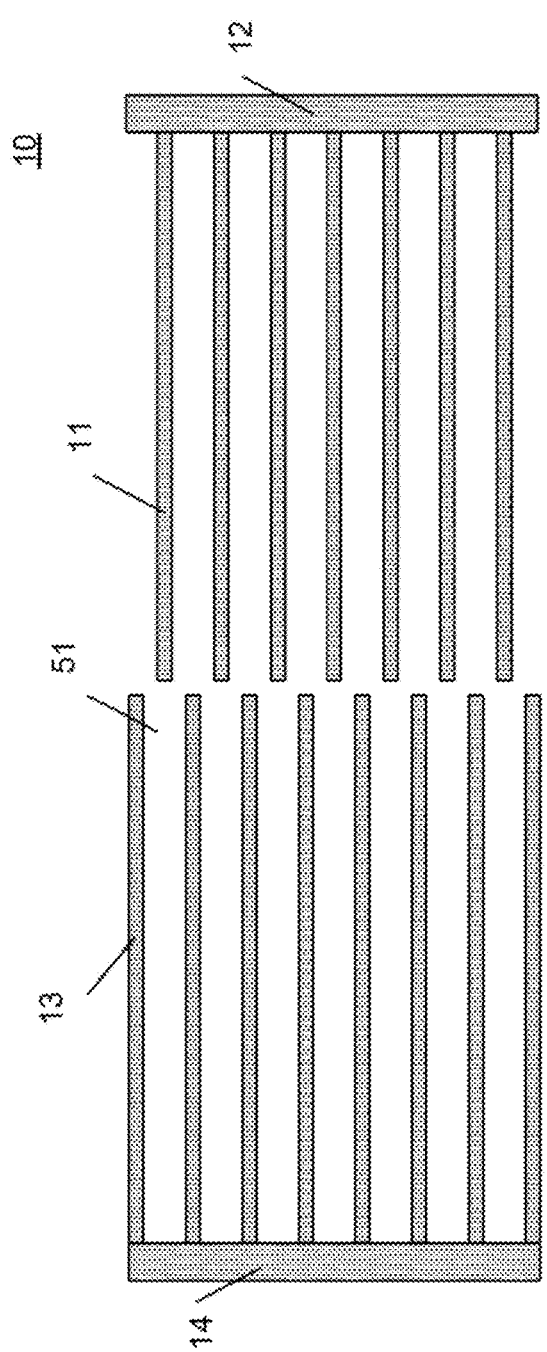
FIG. 20 is a plan view of a comb drive for a comb actuator that may use the disclosed flexures in accordance with embodiments of the disclosed technology.

FIGS. 20-22 illustrate actuators for moving an optoelectronic device that may use the flexures described herein in accordance with particular embodiments. FIG. 20 illustrates a plan view of a comb drive 10 that may be implemented in comb drive actuators in accordance with embodiments. Comb drive 10 may be an electrostatic comb drive. Comb drive 10 may include comb finger arrays 15 and 16, which may be fabricated on silicon using MEMS processes such as photolithography and etching.

As illustrated, comb finger array 16 includes comb fingers 11 and spine 12 that connects comb fingers 11 to one another. Similarly, comb finger array 15 includes comb fingers 13 and spine 14 that connects comb fingers 13 to one another. Comb fingers 11 and 13 may be inter-digitated, such that comb fingers 11 substantially line up with spaces 17 between comb fingers 13, and comb fingers 13 substantially line up with the spaces 18 between comb fingers 13.

When a voltage is applied between comb fingers 11 and comb fingers 13, comb finger array 16 and comb finger array 15 are attracted to or repelled from each other with an electrostatic force proportional to the square of the applied voltage. This electrostatic force may cause comb finger arrays 15 and 16 to move toward or away from one another, depending on the polarity of the electrostatic force (or the voltage). Additionally, the speed with which comb finger arrays 15 and 16 move with respect to one another may depend on the electrostatic force applied. Typically, the design of comb drive 10 is such that comb fingers 11 and 13 may be pulled into or pushed out of an overlapping state by the electrostatic force between comb finger array 15 and comb finger array 16. When comb finger arrays 15 and 16 overlap, comb fingers 11 reside at least partially within space 17 of comb finger array 15, and comb fingers 13 reside at least partially within space 18 of comb finger array 16.

The ratio of comb finger width to depth may be chosen to avoid comb fingers 11 bending into comb fingers 13 when comb fingers 11 and 13 are overlapped. For example, comb fingers 11 and/or 13 may be about 6 micrometers wide by about 150 micrometers long. In general, comb fingers 11 and/or 13 may be between about 1 and 10 micrometers wide and about 20 and 500 micrometers long. The distance between two adjacent comb fingers 11 (or 13) subtracted by the width of one of the corresponding comb finger 13 (or 11) sets the total gap between comb fingers 11 and 13 when brought into overlap by the electrostatic force. In some instances, it may be desirable for this total gap to be relatively small, in order to increase the electrostatic force between comb fingers 11 and comb fingers 13. In addition, it may also be desirable for the total gap to be large enough to deal with variations in the width of comb fingers 11 and/or 13 that arise from process variations. For example, the total gap may be about 5 to 10 micrometers.

The depth of comb fingers 11 and 13 may generally be limited by the particular fabrication process used, and specifically by the etching aspect ratio of that process—this is because it may generally be desirable for the width of comb fingers 11 and 13 on the top to be substantially the same as the width of comb fingers 11 and 13 on the bottom. (The depth aspect of comb fingers 11 and 13 is not illustrated in FIG. 20, but would extend into or out of the page.) For example, comb fingers 11 and 13 may be about 50 to 250 micrometers in depth. Spaces 17 and 18 may either be etched away entirely, or may be removed by other methods known in the art of MEMS micromachining.

FIG. 21A illustrates a plan view of a comb drive actuator in accordance with example embodiments of the present disclosure. As shown in FIG. 21A, the illustrated comb drive actuator includes comb finger arrays 15 and 16 (some details of which—e.g., spines 12 and 14—are illustrated in FIG. 20 but are not shown in FIG. 21A), first frame piece 21, and second frame piece 19. Although not shown in detail in FIG. 21A, comb fingers 11 and 13 extend from left to right, and vice versa, in comb finger arrays 15 and 16. Spine 14 of comb finger array 15 may be attached to second frame piece 19, while spine 12 of comb finger array 16 may be attached to first frame piece 21. Configured as such, when comb finger arrays 15 and 16 are attracted to or repelled from one another such that movement occurs, first and second frame pieces 21 and 19 are likewise caused to move (e.g., from left to right or vice versa in FIG. 21A).

FIG. 21B illustrates a plan view of comb drive actuator 20 in accordance with example embodiments of the present disclosure. As shown in FIG. 21B, one embodiment of comb drive actuator 20 includes one or more comb drives 10 arranged in a substantially parallel fashion. In the particular embodiment of FIG. 21B, there are nine comb drives 10 shown, but various embodiments of comb drive 20 actuator may include any number, size, and shape of comb drives 10. Comb drive actuator 20 further includes first frame 22, second frame 24, and motion control 26. First frame 22 is illustrated with a stepped shape to account for the varying lengths of the comb drives 10 shown in this particular embodiment of comb drive actuator 20. Nevertheless, in other embodiments—for example, in which all comb drives 10 are uniform in length—the shape of first frame 22 may vary to attach to an end of comb drives 10. In the illustrated embodiment, the stepped shape of first frame 22 and the corresponding diminishing lengths of comb drives 10 allows for a decreased footprint of actuator 30, as will be shown in FIG. 22A. Other variations of comb drive 10 length, shape, arrangement, and configuration may be used to achieve differing degrees, directions, and/or precision of controlled forces, various size footprints, and other characteristics, as will be appreciated by one of skill in the art upon studying the present disclosure.

Although the details of each of comb drives 10 are not shown in FIG. 21B, in the illustrated embodiment of FIG. 21B, spine 12 is connected to first frame 22 and spine 14 is connected to second frame 24. FIG. 21A illustrates one way in which this may be done. In various embodiments, spines 12 and 14 of comb finger arrays 15 and 16 may be attached to first and second frames 22 and 24 in different configurations to achieve different purposes. For example, in one embodiment, for each comb drive 10 of a set of comb drives, spine 12 is attached to first frame 22 while spine 14 is attached to second frame 24. Such a configuration results in a parallel cascade of comb drives 10 that may increase the electrostatic force ultimately applied to first and second frames 22 and 24. In another example embodiment, the comb drives 10 are arranged in a back-to-back fashion to achieve bi-directional movement. In this configuration, for a first comb drive 10, spine 12 is connected to first frame 22 and spine 14 is connected to second frame 24. For a second comb drive 10, however, spine 12 is connected to second frame 24 and spine 14 is connected to first frame 22. Such a configuration results in a back-to-back placement of comb drives 10 that allows for bidirectional movement.

Further regarding comb drive actuator 20, comb drive spines 12 and 14 and first and second frames 22 and 24, in various instances, may be designed wide and deep enough to be rigid and not flex substantially under an applied range of electrostatic forces. For example, spines 12 and 14 may be about 20 to 100 micrometers wide and about 50 to 250 micrometers deep, and first and second frames 22 and 24 may be larger than about 50 micrometers wide and about 50 to 250 micrometers deep.

As mentioned above, one embodiment of comb drive actuator 20 also includes motion control 26 that limits the motion of comb finger arrays 15 and 16 to be substantially parallel to the length of comb fingers 11 and 13 (e.g., left to right in FIG. 21B). In one example implementation of the disclosure, motion control 26 is a double parallel flexure motion control, such as is illustrated in FIG. 21B. A double parallel flexure motion control may produce nearly linear motion, but there may be a slight run-out known as arcuate motion. Nevertheless, the gap on one side of comb fingers 11 may not be equal to the gap on the other side of comb fingers 11, and this may be used advantageously in design to correct for effects such as arcuate motion of a double parallel flexure motion control.

Referring again to the embodiment of comb drive actuator 20 illustrated in FIG. 21B, motion control 26 is a double parallel flexure. Nevertheless, motion control 26 may include other structures that serve to control the motion of first frame 22 and second frame 24. Each motion control 26 in the illustrated embodiment includes thinner portions 25 and 27 on the respective ends of motion control 26. Thinner portions 25 and 27 allow bending when there is a translation of first frame 22 with respect to second frame 24. In terms of dimensions, the thicker portion of motion control 26 may be, for example, about 10 to 50 micrometers wide, and thinner portions 25 and 27 may be about 1 to 10 micrometers wide. In various embodiments, any number and type of motion controls 26 may be used as desired to control or limit the motion of comb finger arrays 15 and 16. Controlled motion may enhance the overall precision with which actuator 30 moves or positions platform 45.

Figure 22A:
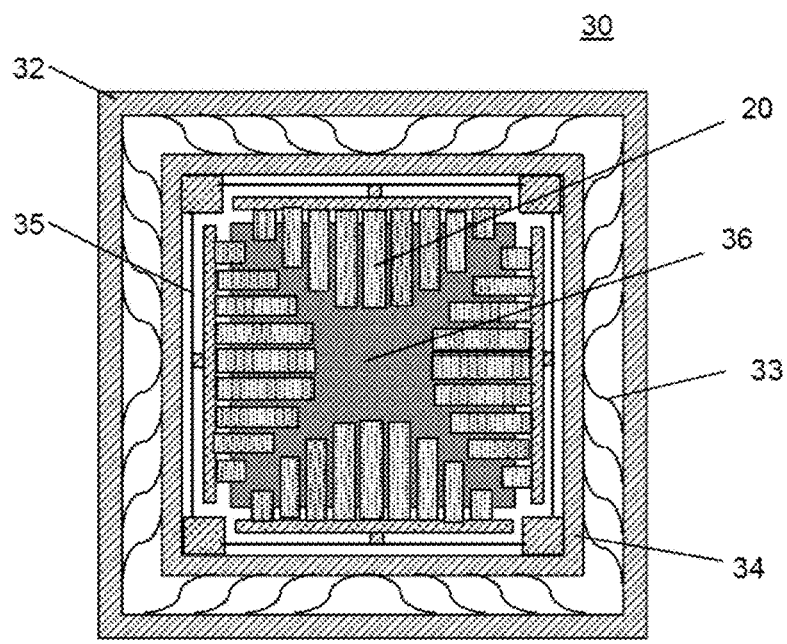
FIG. 22A illustrates a plan view of an actuator that may use the disclosed flexures in accordance with embodiments of the disclosed technology.
Figure 22B:
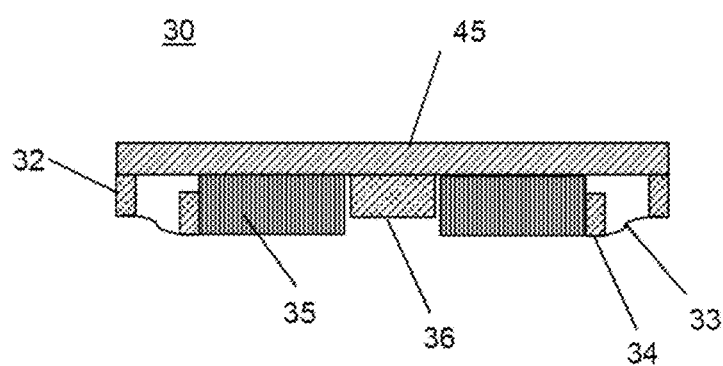
FIG. 22B illustrates a cross-sectional view of an actuator that may use the disclosed flexures in accordance with embodiments of the disclosed technology.

FIG. 22A illustrates a plan view of actuator 30 in accordance with example embodiments of the present disclosure. FIG. 22B illustrates a cross-sectional view of actuator 30 in accordance with example embodiments of the present disclosure. As shown in FIG. 22A, actuator 30 includes outer frame 32 connected to inner frame 34 by one or more spring elements 33. Further, actuator 30 includes one or more comb drive actuators 20 that apply a controlled force (e.g., an electrostatic force developed from a voltage) between outer frame 32 and inner frame 34. Embodiments of actuator 30 are suitable for moving a platform (e.g., 45) having electrical connections, for actuator 30 enables precise, controlled, and variable forces to be applied between inner and outer frames 34 and 32 in multiple degrees of freedom (including linear and rotational, for example), and may be implemented using a highly compact footprint. Moreover, actuator 30 may utilize MEMS devices for reduction in power. Accordingly, actuator 30 provides multiple benefits over conventional solutions to optical image stabilization and autofocus applications constrained by size, power, cost, and performance parameters, such as in smartphone and other applications described herein.

As explained with reference to FIG. 21B, each comb drive actuator 20 includes one or more comb drives 10. Spring elements 33 may be electrically conductive and may be soft in all movement degrees of freedom. In various embodiments, spring elements 33 route electrical signals from electrical contact pads on outer frame 32 to electrical contact pads on the inner frame 34. In example implementations, spring elements 33 come out from inner frame 34 in one direction, two directions, three directions, or in all four directions.

In one embodiment, actuator 30 is made using MEMS processes such as, for example, photolithography and etching of silicon. In one embodiment, actuator 30 moves +/−150 micrometers in plane, and spring elements 33 are designed to tolerate this range of motion without touching one another (e.g., so that separate electrical signals can be routed on the various spring elements 33). For example, spring elements 33 may be S-shaped flexures ranging from about 1 to 5 micrometers in thickness, about 2 to 20 micrometers wide, and about 150 to 1000 micrometers by about 150 to 1000 micrometers in the plane.

In order for spring elements 33 to conduct electricity well with low resistance, spring elements 33 may contain, for example, heavily doped polysilicon, silicon, metal (e.g., aluminum), a combination thereof, or other conductive materials, alloys, and the like. For example, spring elements 33 may be made out of polysilicon and coated with a roughly 2000 Angstrom thick metal stack of Aluminum, Nickel, and Gold. In one embodiment, some spring elements 33 are designed differently from other spring elements 33 in order to control the motion between outer frame 32 and inner frame 34. For example, four to eight (or some other number) of spring elements 33 may have a device thickness between about 50 and 250 micrometers. Such a thickness may somewhat restrict out-of-plane movement of outer frame 32 with respect to inner frame 34.

In another embodiment, actuator 30 includes central anchor 36, and the one or more comb drives 20 apply a controlled force between inner frame 34 and central anchor 36. In this embodiment, first frame 22 is an connected to or an integral part of central anchor 36. One or more comb drive actuators 20 may be otherwise attached to central anchor 36, and central anchor 36 may be mechanically fixed with respect to outer frame 32. In one instance, second frame 24 is connected to inner frame 34 through flexures 35 that are relatively stiff in the respective comb-drive-actuator direction of motion and relatively soft in the orthogonal direction. This may allow for controlled motion of inner frame 34 with respect to outer frame 32, and thus, more precise positioning.

Figure 22C:
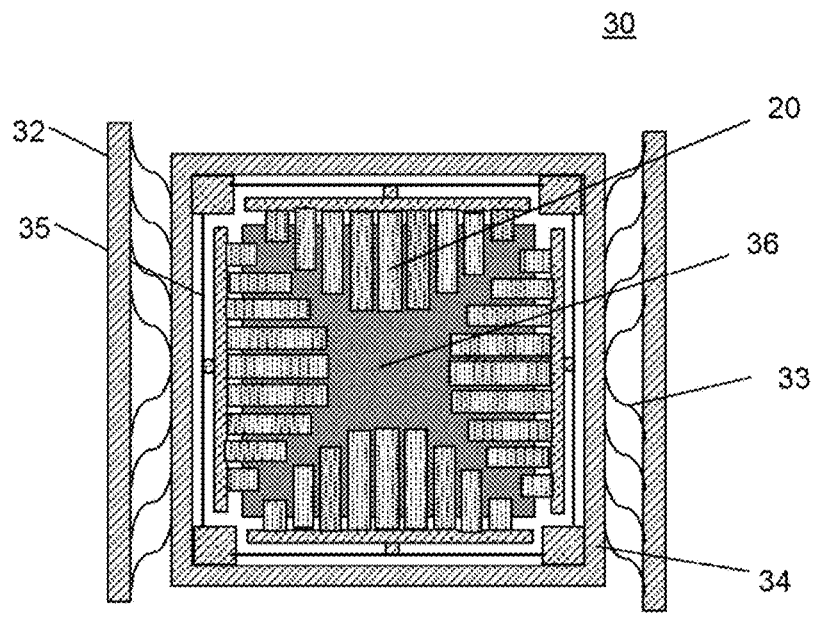
FIG. 22C illustrates a plan view of an actuator that may use the disclosed flexures in accordance with embodiments of the disclosed technology.
Figure 22D:
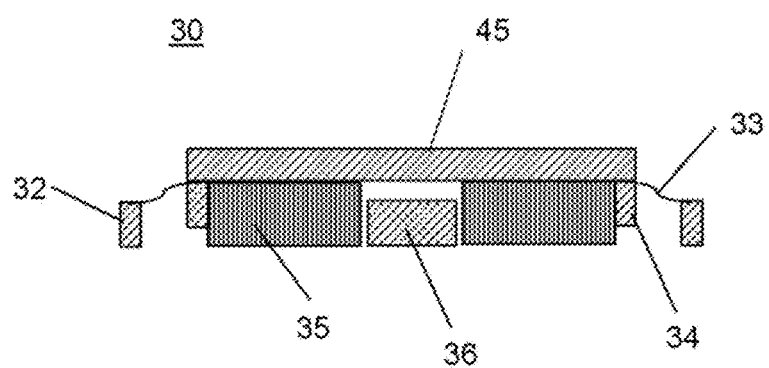
FIG. 22D illustrates a cross-sectional view of an actuator that may use the disclosed flexures in accordance with embodiments of the disclosed technology.

Outer frame 32, in some implementations of actuator 30, is not continuous around the perimeter of actuator 30, but is broken into two, three, or more pieces. For example, FIGS. 22C and 22D illustrate plan and cross-sectional views of actuator 30 in accordance with example embodiments of the present disclosure in which outer frame 32 is divided into two sections, and spring elements 33 come out in only two directions. Similarly, inner frame 34 may be continuous or may be divided into sections, in various embodiments.

As shown in FIG. 22A, there may be four comb drives 10 total—two comb drives 10 actuate in one direction in the plane of actuator 30, and the other two comb drives 10 actuate in an orthogonal direction in the plane of actuator 30. Various other comb drive actuator 20 arrangements are possible. Such arrangements may include more or less comb drives 10, and may actuate in more or less degrees of freedom (e.g., in a triangular, pentagonal, hexagonal formation, or the like), as will be appreciated by one of skill in the art upon studying the present disclosure.

In one embodiment, platform 45 is attached to outer frame 32 and to central anchor 36. In this manner, platform 45 may fix outer frame 32 with respect to central anchor 36 (and/or vice versa). Inner frame 34 may then move with respect to both outer frame 32 and central anchor 36, and also with respect to platform 45. In one embodiment, platform 45 is a silicon platform. Platform 45, in various embodiments, is an optoelectronic device, or an image sensor, such as a charge-coupled-device (CCD) or a complementary-metal-oxide-semiconductor (CMOS) image sensor.

FIG. 22B illustrates that the size of actuator 30 may be substantially the same as the size as platform 45, and platform 45 may attach to outer frame 32 and central anchor 36, thus mechanically fixing central anchor 36 with respect to outer frame 32. In one example implementation, platform 45 is the OV8835 image sensor from Omni Vision with an optical format of 1/3.2". In this implementation, the size of both actuator 30 and platform 45 can be equal to about 6.41 mm by 5.94 mm. As shown in FIG. 22D, in one embodiment of actuator 30, platform 45 is smaller than actuator 30, and platform 45 attaches to inner frame 34. In this particular embodiment, outer frame 32 is fixed relative to inner frame 34, and inner frame 34 is moved by the various comb drive actuators 20.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:
1. A flexure, comprising:
   a first support end connected to a first frame;
   a second support end connected to a second frame; and
   a buckled section connecting the first support end to the second support end;
   wherein the flexure has a length that is substantially greater than a width of the flexure, wherein the flexure has a thickness that is substantially less than the width of the flexure, and wherein the first support end and the second support end have a width that is wider than the buckled section connecting the first support end to the second support end.

2. The flexure of claim 1, wherein the flexure comprises a layer of polysilicon.

3. The flexure of claim 1, wherein the flexure comprises a layer of metal and is electrically conductive.

4. The flexure of claim 1, wherein the buckled section connecting the first support end to the second support end has a non-uniform width.

5. The flexure of claim 1, wherein the flexure in its unbuckled state comprises:
a first straight portion;
a second straight portion; and
a curved portion that joins the first straight portion and the second straight portion.

6. The flexure of claim 1, wherein the stiffness of the flexure in the buckled state is less than the stiffness of the flexure in the unbuckled state.

7. The flexure of claim 1, wherein the stiffness of the flexure in the buckled state is a positive post-buckle stiffness.

8. The flexure of claim 1, wherein the stiffness of the flexure in the buckled state is a negative post-buckle stiffness.

9. The flexure of claim 1, wherein the buckled section buckles in a radial direction between the first support end and the second support end, and wherein the buckled section buckles in a tangential direction to the first support end and the second support end.

10. The flexure of claim 1, wherein the buckled section is serpentine-shaped.

11. The flexure of claim 1, wherein the first support end and the second support end are not tangentially aligned.

12. The flexure of claim 2, wherein the flexure further comprises a layer of metal that is electrically conductive, and wherein the layer of metal and the layer of polysilicon are offset.

13. The flexure of claim 2, wherein the flexure further comprises a layer of metal that is electrically conductive, and wherein the layer of metal and the layer of polysilicon are split for at least a portion of the buckled section.

14. The flexure of claim 3, further comprising a layer of silicon oxide, wherein the layer of metal covers the entire length of the flexure, and wherein the layer of silicon oxide covers the first support end, the second support end and only ends of the buckled section connected to the first support end and the second support end.

15. A stage comprising a flexure array comprising a plurality of flexures joining a first frame and a second frame, wherein:
the first frame and the second frame are substantially on a plane;
the flexure array is substantially on the plane prior to buckling by the plurality of flexures; and
the flexure array is bent substantially out of the plane after buckling by the plurality of flexures, wherein the plurality of flexures includes a plurality of first support ends and a plurality of second support ends connected by a plurality of buckled sections, and wherein the plurality of first support ends and the plurality of second support ends have a width that is wider than the plurality of buckled sections.

16. The stage of claim 15, wherein each of the plurality of flexures has a length that is substantially greater than its width.

17. The stage of claim 15, wherein each of the plurality of flexures is electrically conductive.

18. The stage of claim 15, wherein the flexure array has lower stiffness in at least one degree of freedom.

19. The stage of claim 15, wherein each of the plurality of flexures contains at least two layered materials, and wherein at least one of the layered materials is metal.

20. The stage of claim 15, further comprising a motion limiter configured to prevent the buckled plurality of flexures from failing by limiting motion of the flexure array.

* * * * *